(12) United States Patent
Weber et al.

(10) Patent No.: US 9,147,763 B2
(45) Date of Patent: Sep. 29, 2015

(54) CHARGE-COMPENSATION SEMICONDUCTOR DEVICE

(71) Applicant: Infineon Technologies Austria AG, Villach (AT)

(72) Inventors: Hans Weber, Bayerisch Gmain (DE); Franz Hirler, Isen (DE); Armin Willmeroth, Augsburg (DE); Stefan Gamerith, Villach (AT)

(73) Assignee: Infineon Technologies Austria AG, Villach (AT)

( * ) Notice: Subject to any disclaimer, the term of this patent is extended or adjusted under 35 U.S.C. 154(b) by 11 days.

(21) Appl. No.: 14/033,941

(22) Filed: Sep. 23, 2013

(65) Prior Publication Data

US 2015/0084120 A1    Mar. 26, 2015

(51) Int. Cl.
*H01L 29/66* (2006.01)
*H01L 29/78* (2006.01)

(52) U.S. Cl.
CPC .................................. *H01L 29/7804* (2013.01)

(58) Field of Classification Search
CPC .................. H01L 29/7804; H01L 29/7802
USPC ......................................................... 257/329
See application file for complete search history.

(56) References Cited

U.S. PATENT DOCUMENTS

| | | | |
|---|---|---|---|
| 5,216,275 A | 6/1993 | Chen | |
| 6,551,909 B1 | 4/2003 | Fujihira | |
| 6,630,698 B1 | 10/2003 | Deboy et al. | |
| 6,683,347 B1 | 1/2004 | Fujihira | |
| 6,724,042 B2 | 4/2004 | Onishi et al. | |
| 6,734,520 B2 | 5/2004 | Kapels et al. | |
| 6,819,089 B2 | 11/2004 | Deboy et al. | |
| 6,831,338 B1 | 12/2004 | Roy | |
| 6,936,892 B2 | 8/2005 | Fujihira | |
| 7,253,476 B2 | 8/2007 | Fujihira | |

(Continued)

FOREIGN PATENT DOCUMENTS

| | | |
|---|---|---|
| DE | 102005047056 B3 | 1/2007 |
| DE | 102005041322 A1 | 3/2007 |
| DE | 102007018631 B4 | 1/2009 |

OTHER PUBLICATIONS

Weber, H., et al. "Charge Compensation Semiconductor Device." U.S. Appl. No. 13/541,884, filed Jul. 5, 2012.

*Primary Examiner* — Thao X Le
*Assistant Examiner* — Patricia Reddington
(74) *Attorney, Agent, or Firm* — Murphy, Bilak & Homiller, PLLC

(57) ABSTRACT

An active area of a semiconductor body includes a first charge-compensation structure having spaced apart n-type pillar regions, and an n-type first field-stop region of a semiconductor material in Ohmic contact with a drain metallization and the n-type pillar regions and having a doping charge per area higher than a breakdown charge per area of the semiconductor material. A punch-through area of the semiconductor body includes a p-type semiconductor region in Ohmic contact with a source metallization, a floating p-type body region and an n-type second field-stop region. The floating p-type body region extends into the active area. The second field-stop region is in Ohmic contact with the first field-stop region, forms a pn-junction with the floating p-type body region, is arranged between the p-type semiconductor region and floating p-type body region, and has a doping charge per area lower than the breakdown charge per area of the semiconductor material.

20 Claims, 10 Drawing Sheets

(56) References Cited

U.S. PATENT DOCUMENTS

| | | |
|---|---|---|
| 7,646,061 B2 | 1/2010 | Hirler |
| 7,750,397 B2 | 7/2010 | Hirler et al. |
| 7,781,842 B2 | 8/2010 | Hirler et al. |
| 7,875,951 B2 | 1/2011 | Rieger et al. |
| 8,168,480 B2 | 5/2012 | Lin et al. |
| 2002/0096708 A1 | 7/2002 | Ahlers et al. |
| 2005/0042830 A1 | 2/2005 | Blanchard |
| 2005/0045922 A1 | 3/2005 | Ahlers et al. |
| 2005/0082591 A1 | 4/2005 | Hirler et al. |
| 2007/0085136 A1 | 4/2007 | Krumrey et al. |
| 2007/0126056 A1 | 6/2007 | Hirler |
| 2007/0138544 A1 | 6/2007 | Hirler et al. |
| 2007/0272978 A1* | 11/2007 | Mauder et al. ............... 257/330 |
| 2008/0265329 A1 | 10/2008 | Hirler et al. |
| 2009/0267174 A1 | 10/2009 | Willmeroth et al. |
| 2010/0078775 A1* | 4/2010 | Mauder et al. ............... 257/655 |
| 2010/0276729 A1 | 11/2010 | Aoi et al. |
| 2010/0301386 A1 | 12/2010 | Lin et al. |
| 2012/0001224 A1 | 1/2012 | Patti et al. |
| 2012/0088353 A1 | 4/2012 | Willmeroth et al. |
| 2013/0234239 A1 | 9/2013 | Weber et al. |
| 2014/0183621 A1* | 7/2014 | Gamerith et al. ............ 257/329 |

* cited by examiner

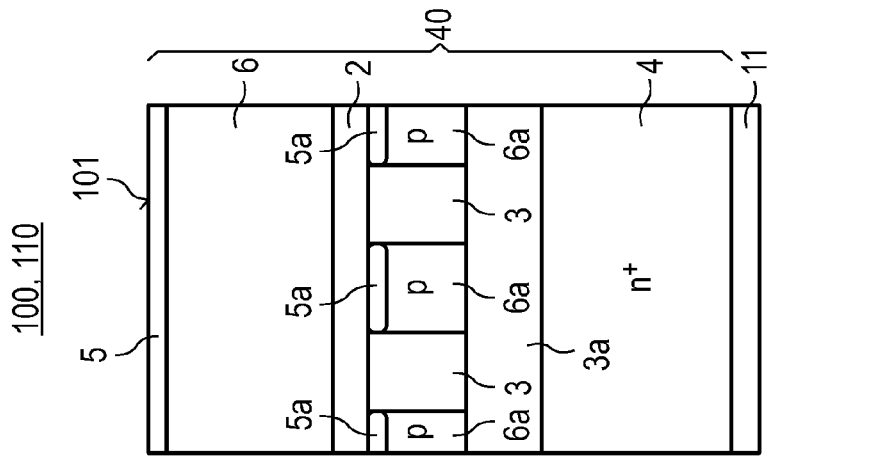
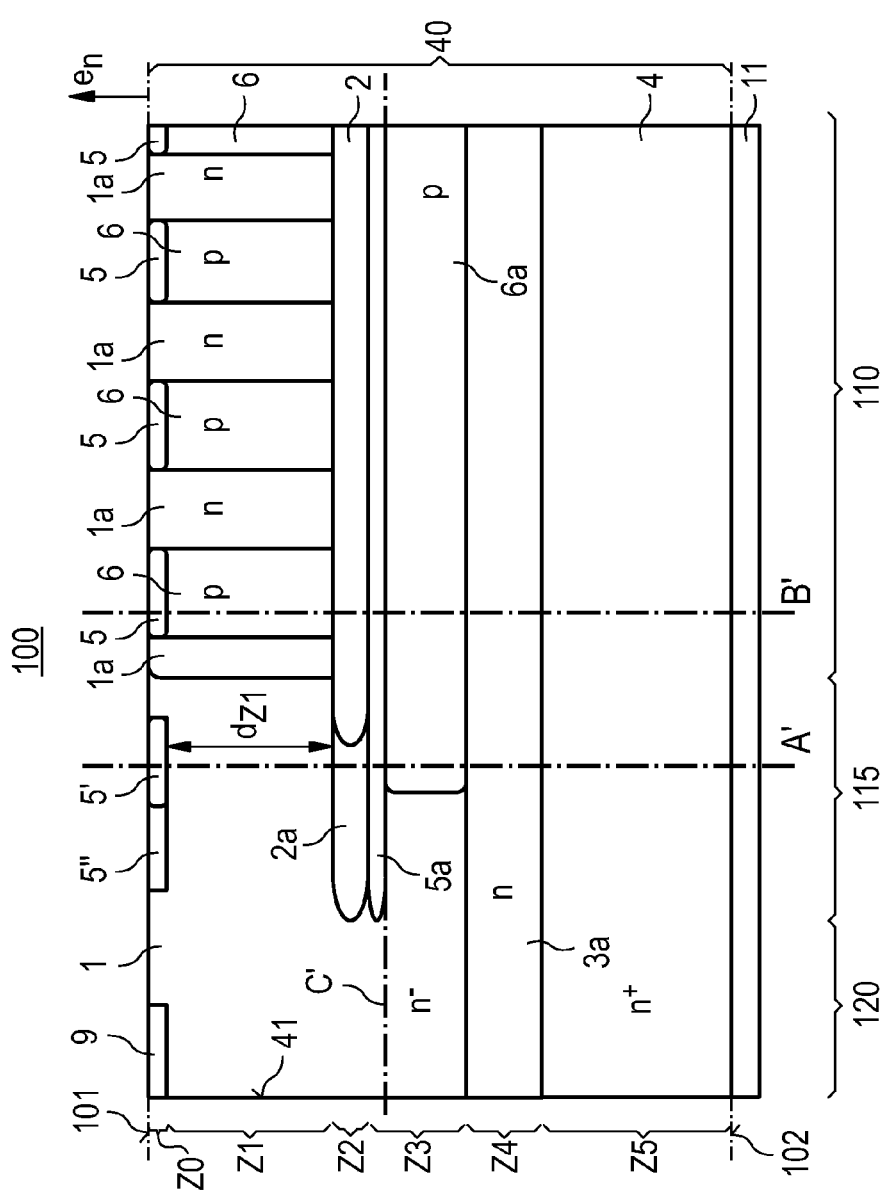

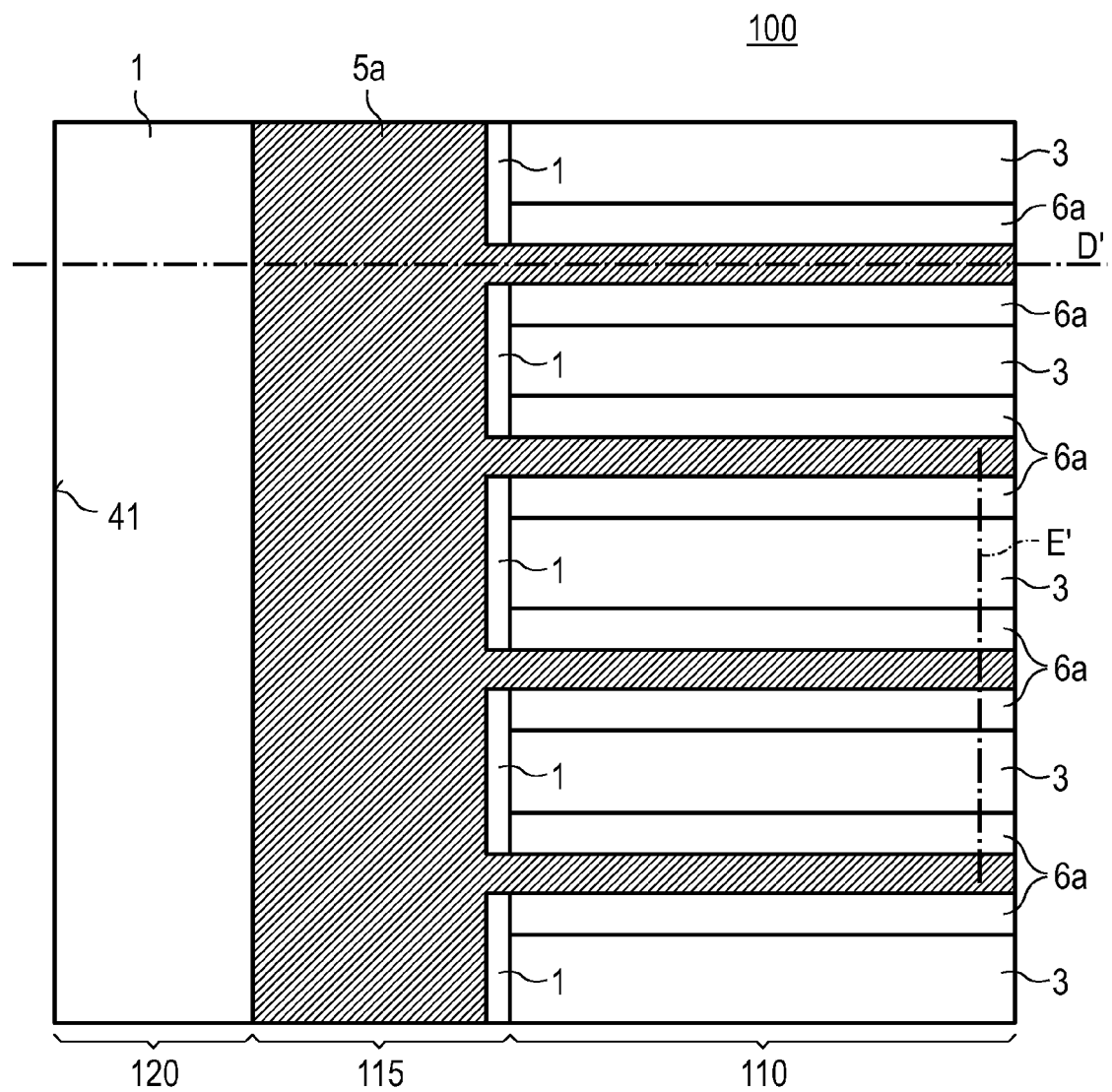

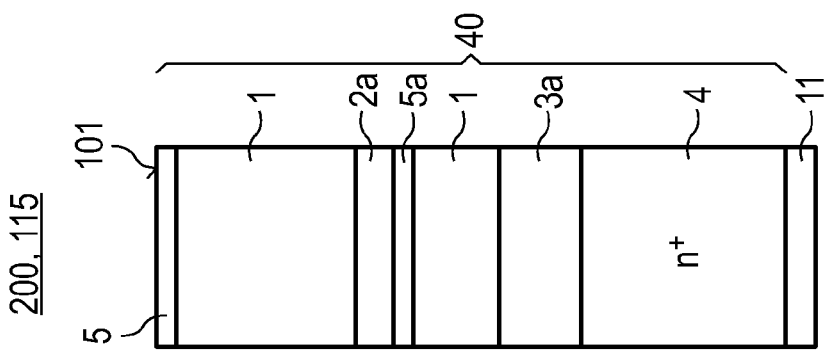
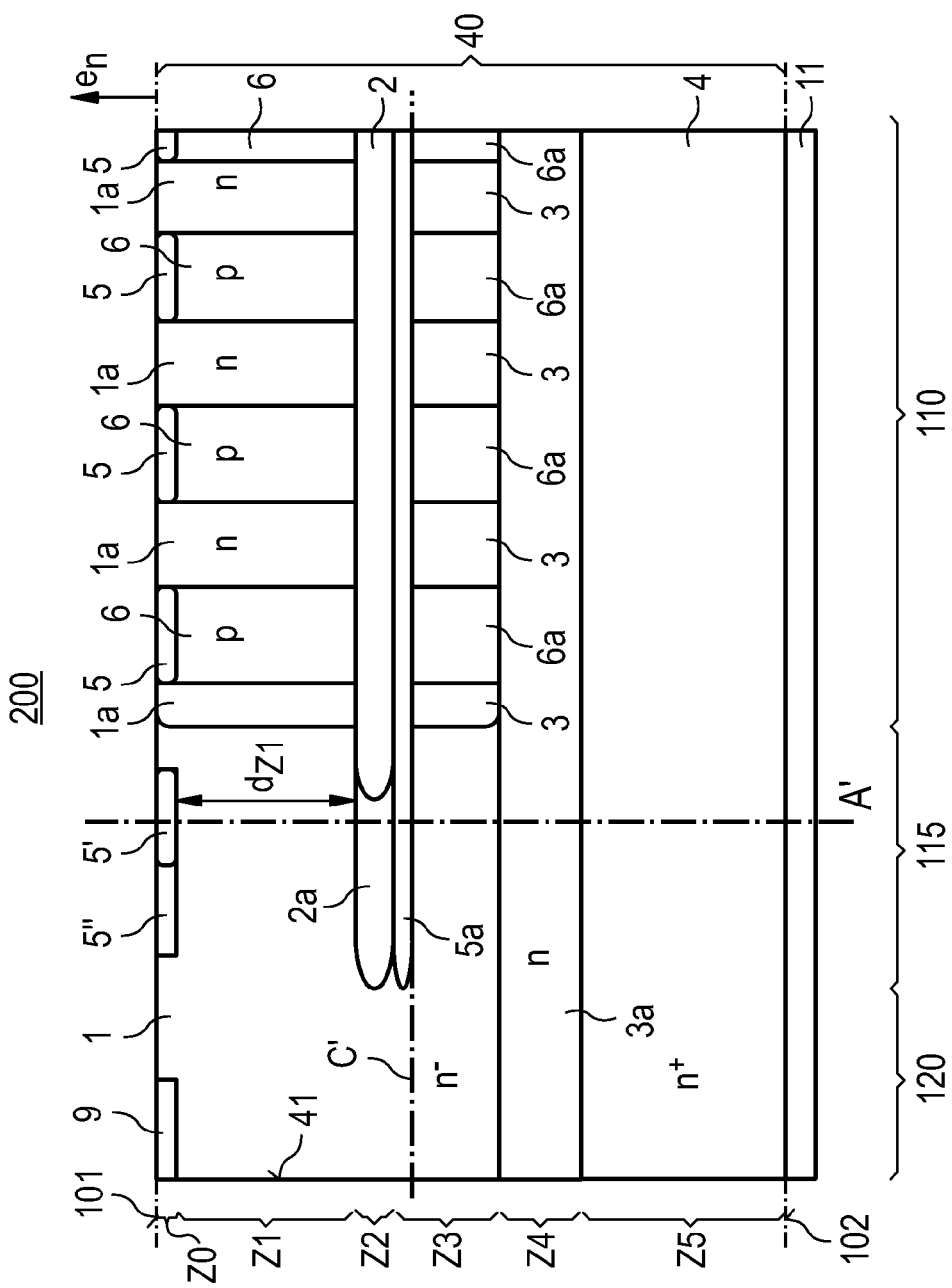

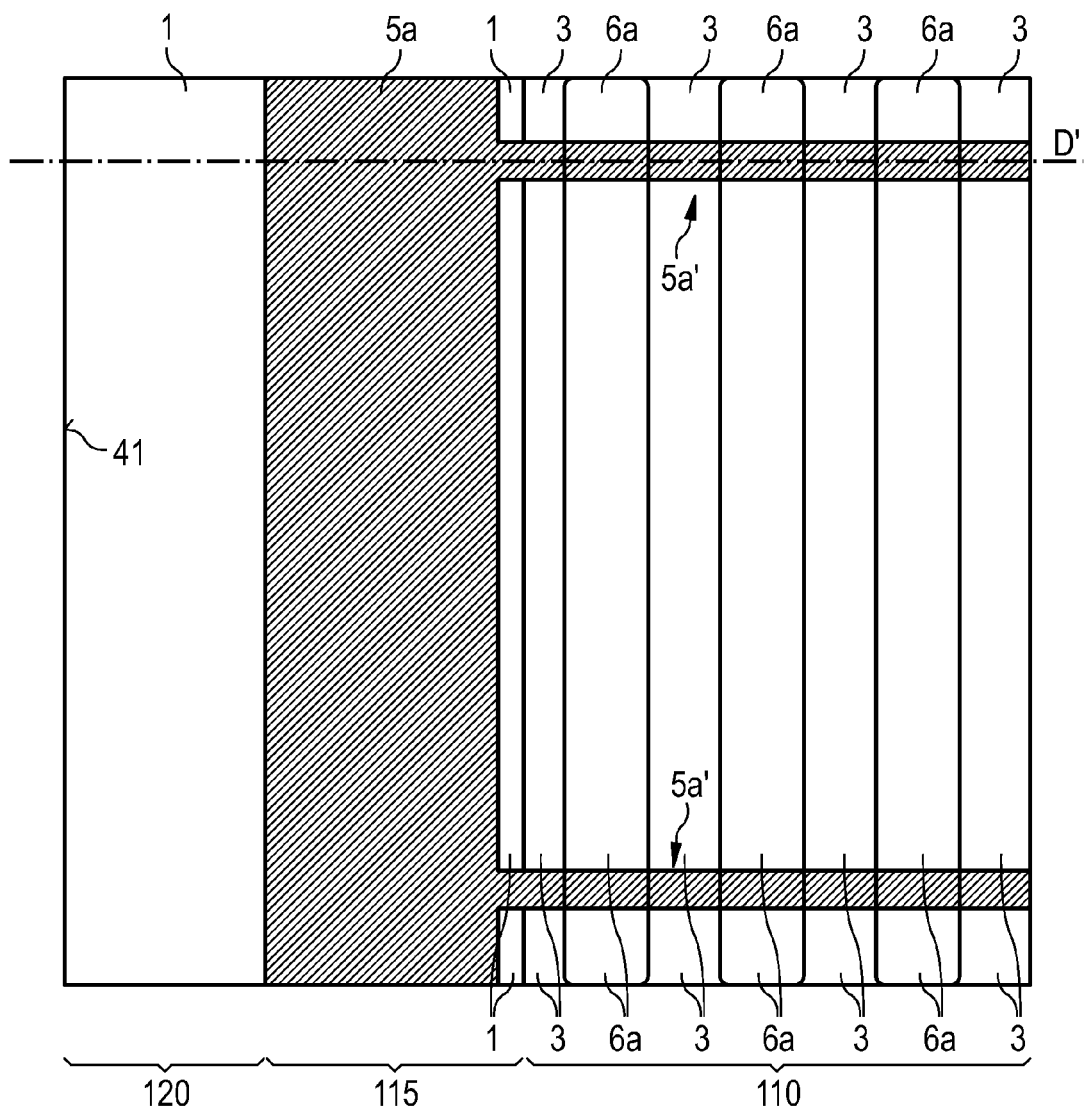

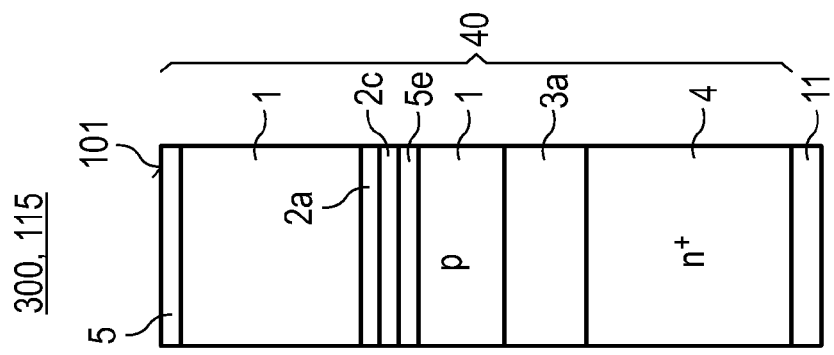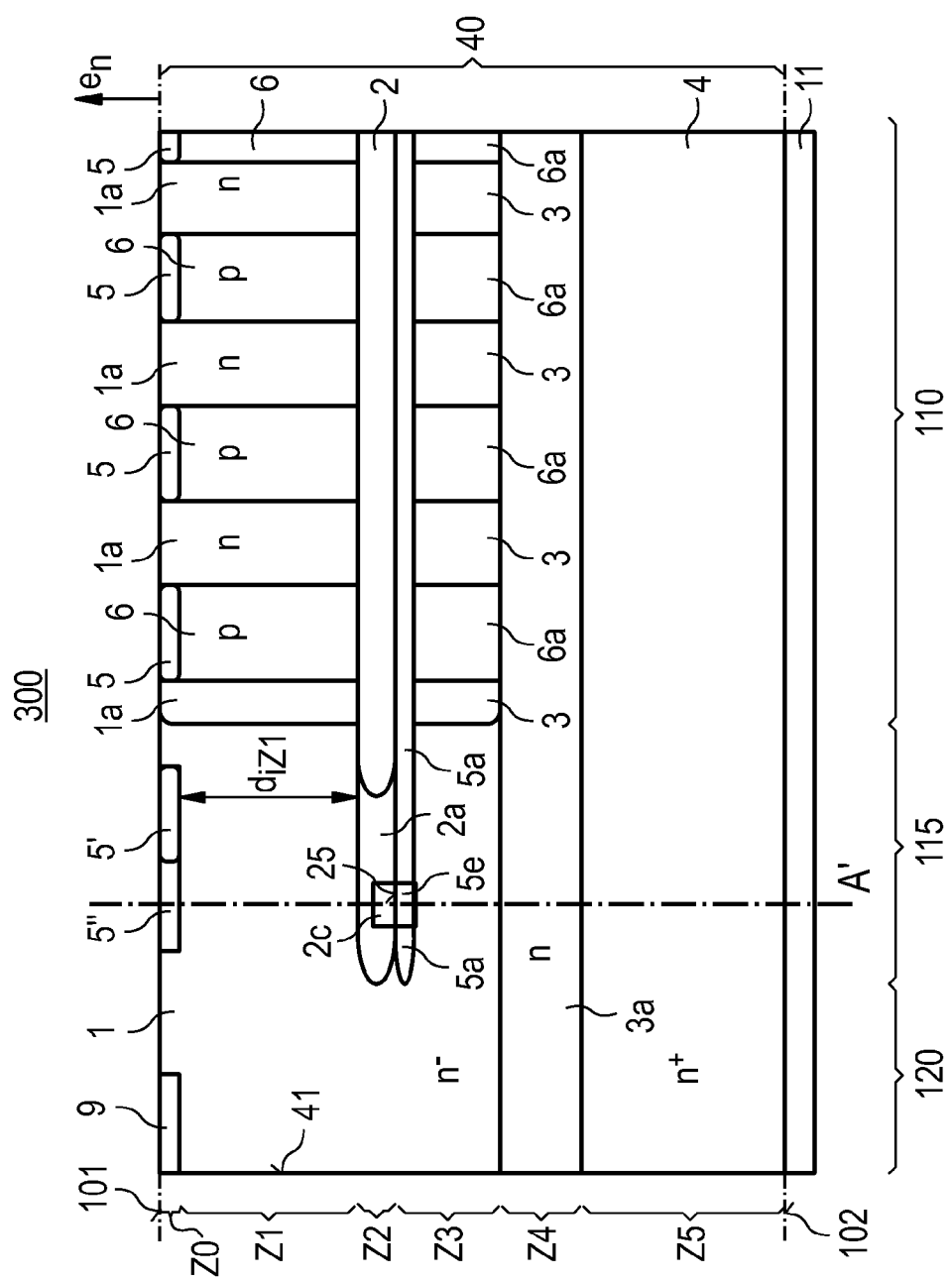

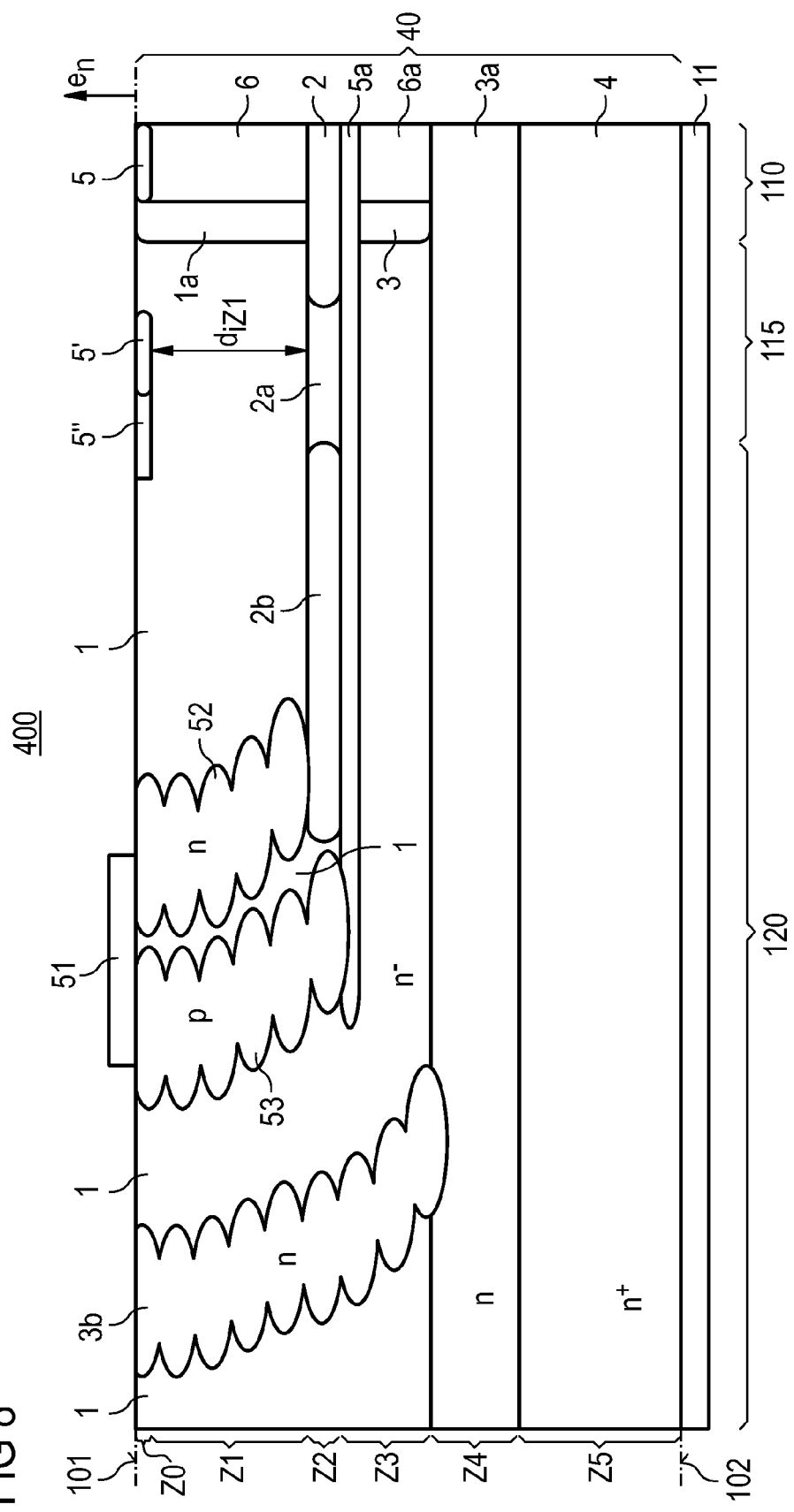

CHARGE-COMPENSATION SEMICONDUCTOR DEVICE

TECHNICAL FIELD

Embodiments of the present invention relate to semiconductor devices having charge-compensation structures, in particular to power semiconductor transistors having two charge-compensation structures.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance Ron and high breakdown voltages $U_{bd}$ are often desired.

For this purpose charge-compensation semiconductor devices were developed. The compensation principle is based on a mutual compensation of charges in n- and p-doped zones in the drift region of a vertical MOSFET.

Typically, the charge-compensation structure formed by p-type and n-type zones is arranged below the actual MOSFET-structure with source, body regions and gate regions, and also below the associated MOS-channels which are arranged next to one another in the semiconductor volume of the semiconductor device or interleaved in one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components which results in a significant reduction of the on-state resistance Ron despite the loss of a current-carrying area. The reduction of the on-state resistance Ron of such semiconductor power devices is associated with a reduction of the heat loss, so that such semiconductor power devices with charge-compensation structure remain "cool" compared with conventional semiconductor power devices.

Meanwhile, switching losses of semiconductor devices become more important. Depending on device operation, output charge $Q_{OSS}$ and electric energy $E_{OSS}$, respectively, stored in the space charge region formed in the off-state and during reverse bias, respectively, mainly determine the switching losses. The stored charge $Q_{OSS}$ of semiconductor devices with charge-compensation structures may be comparatively high. This may result in significant switching losses $E_{OSS}$. In addition to enable reverse blocking, the output charge $Q_{OSS}$ (at specific blocking voltage) has to be completely removed which results in switching delays.

In many applications, semiconductor transistors such as MOSFETs are mainly exposed to reverse voltages which are significantly below a rated blocking voltage of the semiconductor device. For example, conventional vertical compensation MOSFETs are often used in circuits with a designed circuit voltage during nominal operation which results in a nominal reverse voltages $U_c$ of only about 30% to about 70% of the rated blocking voltage $U_{bd}$, for example to about 400 V for a rated blocking voltage of 650 V. Furthermore, the conventional compensation MOSFETs are typically designed such that the pn-compensation structure is already substantially depleted in the horizontal direction at comparatively low reverse voltages corresponding to about only 10% of nominal reverse voltages $U_c$ or even less to reduce stored electric energy $E_{OSS}$. Even further, the stored charge $Q_{OSS}$ is mainly determined by the charge $Q_h$ corresponding to the horizontally depletion of conventional compensation structures. Accordingly, there is typically a trade-off between on-resistance $R_{on}$ and stored charge $Q_{OSS}$ in conventional compensation MOSFETs. This may be expressed as $R_{on}*Q_{OSS}=R_{on}*Q_h=$const. Thus, there is typically a trade-off between forward current losses and switching losses in conventional compensation MOSFETs.

Even when taking into account typical voltage spikes, a MOSFET is typically exposed to reverse voltages which are significantly below rated breakdown voltage $U_{bd}$ during normal operation. Higher values may result from unanticipated switching events which occur only rarely. The depletable semiconductor volume of conventional compensation MOSFETs corresponds however to at least 100% of the rated blocking voltage. Accordingly, conventional compensation MOSFETs are typically "oversized" with respect to the stored charge $Q_{OSS}$.

Accordingly, there is a need to improve semiconductor devices with charge-compensation structures.

SUMMARY

According to an embodiment of a semiconductor device, the semiconductor device includes a semiconductor body including a main horizontal surface, an active area, a punch through area, a source metallization arranged on the main horizontal surface and a drain metallization. In the active area, the semiconductor body further includes in a vertical cross-section substantially orthogonal to the main horizontal surface a first charge-compensation structure including a plurality of spaced apart first n-type pillar regions, and an n-type first field-stop region which is comprised of a semiconductor material, is in Ohmic contact with the drain metallization and the first n-type pillar regions, and has a doping concentration per area higher than a breakdown charge per area of the semiconductor material divided by the elementary charge. In the punch-through area, the semiconductor body further includes a p-type semiconductor region in Ohmic contact with the source metallization, a floating p-type body region and an n-type second field-stop region. The floating p-type body region extends from the punch-through area into the active area. The n-type second field-stop region is in Ohmic contact with the first field-stop region, forms a pn-junction with the floating p-type body region, is arranged between the p-type semiconductor region and the floating p-type body region, and has a doping charge per area lower than the breakdown charge per area of the semiconductor material.

According to an embodiment of a semiconductor device, the semiconductor device includes a semiconductor body having a breakdown charge per area and including: a drain region of a first conductivity type; a plurality of spaced apart body regions of a second conductivity type; a first charge-compensation structure; a second charge-compensation structure; a first field-stop region of the first conductivity type having a doping concentration per area higher than the breakdown charge per area of the semiconductor material divided by the elementary charge, and a second field-stop region of the first conductivity type having a doping concentration per area lower than the breakdown charge per area of the semiconductor material divided by the elementary charge. The first charge-compensation structure is arranged between the body regions and the drain region, and includes, in a first cross-section, a plurality of spaced apart first pillar regions of the first conductivity type. The second charge-compensation structure is integrated in the semiconductor body, and includes a plurality of spaced apart second pillar regions of the first conductivity type in Ohmic contact with the drain region. The first field-stop region is arranged between the first charge-compensation structure and the second charge-compensation structure, and is in Ohmic contact with the first pillar regions of the first conductivity type and the second pillar regions of the first conductivity type. The second field-stop region is in Ohmic contact with the first pillar regions of the first conductivity type via the first field-stop region.

According to an embodiment of a semiconductor device, the semiconductor device includes a semiconductor body of a semiconductor material having a breakdown charge per area. The semiconductor body includes a main horizontal surface, an active area, a punch through area, a source metallization arranged on the main horizontal surface and a drain metallization. In a vertical cross-section substantially orthogonal to the main horizontal surface the semiconductor body further includes in the active area: a first charge-compensation structure including a plurality of spaced apart first p-type pillar regions in Ohmic contact with the source metallization; a second charge-compensation structure including a plurality of spaced apart second p-type pillar regions; and an n-type first embedded field-stop region in Ohmic contact with the drain metallization. The n-type first embedded field-stop region is arranged between the first p-type pillar regions and the second p-type pillar regions, and has a doping concentration per area higher than the breakdown charge per area of the semiconductor material divided by the elementary charge. In the punch-through area the semiconductor body further includes: a first semiconductor region in Ohmic contact with the drain metallization; a p-type semiconductor region which is in Ohmic contact with the source metallization and forms a pn-junction with the first semiconductor region; a floating p-type body region which extends from the punch-through area into the active area, has a higher maximum doping concentration than the second p-type pillar regions and adjoins each of the second p-type pillar regions; and an n-type second embedded field-stop region which is in Ohmic contact with the first embedded field-stop region, forms a pn-junction with the floating p-type body region, is arranged between the first semiconductor region and the floating p-type body region, and has a doping concentration per area lower than the breakdown charge per area of the semiconductor material divided by the elementary charge.

According to an embodiment of a vertical semiconductor device, the vertical semiconductor device includes: a semiconductor body having a main horizontal surface and an edge delimiting the semiconductor body in a direction substantially parallel to the main horizontal surface; a first metallization arranged on the main horizontal surface, and a second metallization arranged opposite to the first metallization. The semiconductor body further includes: a first semiconductor region which has a first maximum doping concentration, is in Ohmic contact with the second metallization, and substantially extends to the main horizontal surface and/or the edge; an embedded field-stop zone of a first conductivity type which is in Ohmic contact with the first semiconductor region and the second metallization, has a maximum doping concentration higher than the first maximum doping concentration, and adjoins the first semiconductor region; a second semiconductor region of a second conductivity type which is in Ohmic contact with the first metallization, arranged at least close to the main horizontal surface, forms a rectifying junction with the first semiconductor region, and overlaps with the embedded field-stop zone when viewed from above; a floating body region of the second conductivity type which is arranged between the embedded field-stop zone and the second metallization, and forms a pn-junction with the embedded field-stop zone; a first equipotential semiconductor region of the first conductivity type which is embedded in the first semiconductor region, extends from the embedded field-stop region substantially to the main horizontal surface, and is arranged between the second semiconductor region and the edge; and a second equipotential semiconductor region of the second conductivity type which is embedded in the first semiconductor region, extends from the floating body region substantially to the main horizontal surface, and is arranged between the first equipotential semiconductor region and the edge.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 1A illustrates a vertical cross-section through a semiconductor body of a semiconductor device according to an embodiment;

FIG. 1B illustrates a further vertical cross-section through the semiconductor body illustrated in FIG. 1A according to an embodiment;

FIG. 4 illustrates a horizontal cross-section through the semiconductor body illustrated in FIG. 1A according to an embodiment;

FIG. 5A illustrates a vertical cross-section through a semiconductor body of a semiconductor device according to an embodiment;

FIG. 5B illustrates a further vertical cross-section through the semiconductor body illustrated in FIG. 5A according to an embodiment;

FIG. 6 illustrates a horizontal cross-section through the semiconductor body illustrated in FIG. 5A according to an embodiment;

FIG. 7A illustrates a vertical cross-section through a semiconductor body of a semiconductor device according to an embodiment;

FIG. 7B illustrates a further vertical cross-section through the semiconductor body illustrated in FIG. 7A according to an embodiment;

FIG. 8 illustrates a vertical cross-section through a semiconductor body of a semiconductor device according to an embodiment;

DETAILED DESCRIPTION

Figure 2:
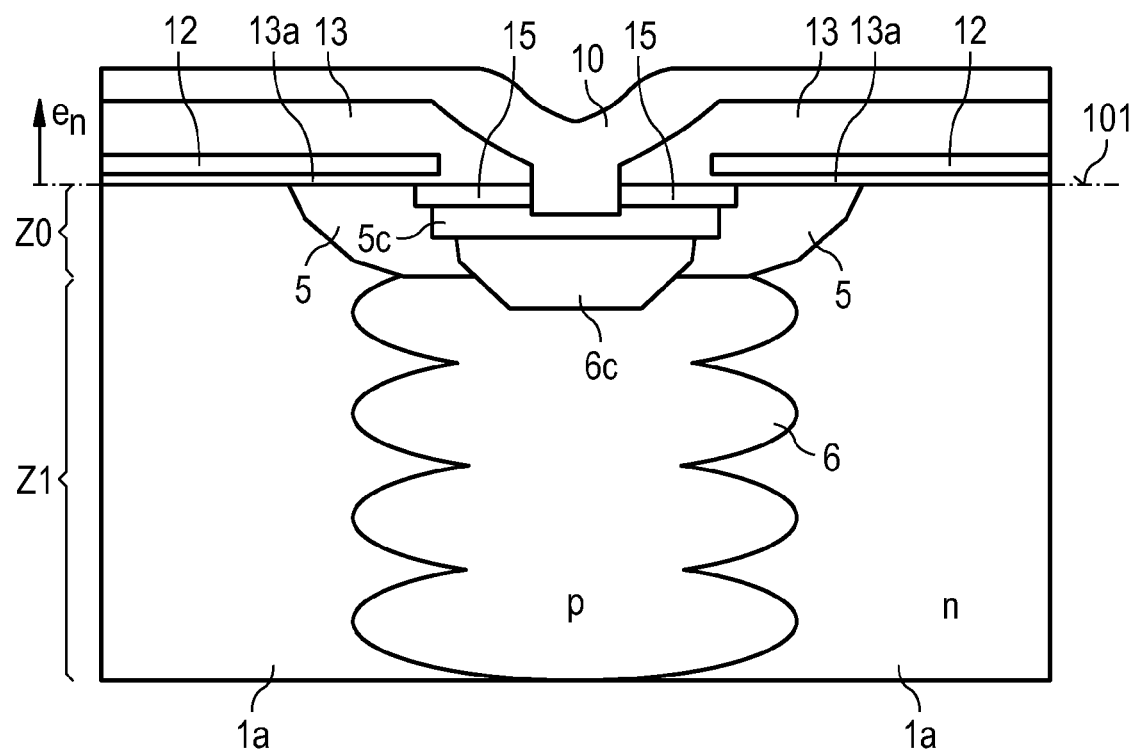
FIG. 2 illustrates a section of the vertical cross-section through the semiconductor device illustrated in FIG. 1 according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to semiconductor devices, in particular to field effect semiconductor transistor and manufacturing methods therefore. Within this specification the terms "semiconductor device" and "semiconductor component" are used synonymously. The formed semiconductor device is typically a vertical semiconductor device such as a vertical MOSFET with a source metallization and an insulated gate electrode arranged on the first surface and a drain metallization arranged on a second surface arranged opposite to the first surface. Typically, the formed semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when viewed from above.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e. g. at the edge and/or backside of the semiconductor device. The edge-termination structure may, for example, lower the field intensity around a termination region of a rectifying junction by spreading the electric field lines across the termination region.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode. In the context of the present specification, the term "in resistive electric contact" intends to describe that there is a ohmic current path, typically a low-ohmic ohmic current path, between respective elements or portions of a semiconductor device when no voltages are applied to and/or across the semiconductor device. Within this specification the terms "in resistive electric contact", "electrically coupled", and "in Ohmic contact" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and insulated from the body region and configured to form and/or control a channel region through the body region.

In the context of the present specification, the term "field plate" intends to describe an electrode which is arranged next to a semiconductor region, typically the drift region or a part thereof, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "floating field plate" intends to describe a conductive region forming an electrode which is arranged in a semiconductor region, typically the drift region, in a vertical cross-section insulated from the semiconductor region at three sides, and configured to trap charges, typically negative charges for an n-type semiconductor region, during the blocking-mode of the semiconductor device so that a portion of the semiconductor region is depleted by the trapped charges. The conductive region is typically made of a material with metallic or near-metallic electric conductivity such as a metal, for example wolfram, highly doped poly-silicon, a silicide or the like. Furthermore, the floating field plate may be formed by a weakly doped monocrystalline semiconductor region in which an electron channel may be formed.

In the context of the present specification, the term "charge-generating structure" intends to describe a structure which is configured to generate and separate electron-hole pairs when an electric field is applied to or across the structure. The term "charge-generating structure" shall embrace a diode-structure, in particular with a $p^{++}$-$n^{++}$-junction, a silicide region or a metal region forming an abutting-contact with a highly doped p-type semiconductor region and a highly doped n-type semiconductor region, a semiconductor region having deep charge traps, and a semiconductor region having lattice defects.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from the forward direction or conducting direction in which a pn-load junction, for example the pn-junction between the body region and the drift region of a MOSFET, is forwardly biased to the opposite direction or reverse direction in which the pn-load junction is reversely biased. The term "hard commutating" as used in this specification intends to describe commutating with a speed of at least about $10^{10}$ V/s, more typically with a speed of at least about $2*10^{10}$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

With reference to FIG. 1A, a first embodiment of a semiconductor device 100 is explained. FIG. 1A illustrates a vertical cross-section through a semiconductor body 40 of the semiconductor device 100. The semiconductor body 40 extends between a first surface 101 and a second surface 102 arranged opposite to the first surface 101. Typically, the first surface 101 is substantially a plane and its normal vector $e_n$ defines a vertical direction. Further, the second surface 102 is typically substantially parallel to the first surface 101. In the following, the first surface 101 and the second surface 102 are also referred to as main horizontal surface 101 and back surface 102, respectively. The semiconductor body 40 as well as the first surface 101 and the second surface extend to an edge 41, for example a sawing edge, delimiting the semiconductor body 40 in a horizontal direction, i.e. in a direction which is substantially parallel to the main horizontal surface 101. The edge 41 may form a substantially straight lateral boundary in the vertical cross-section. Typically, FIG. 1A corresponds to a left section of a complete vertical cross-section through the semiconductor body 40 and a right section of the complete vertical cross-section mirrored at a vertical axis, respectively.

A first metallization (not shown in FIG. 1A), typically forming a source metallization, is arranged on the first surface 101. A second metallization 11, typically forming a drain metallization 11, is arranged on the second surface 102. Furthermore, a third metallization (also not shown in FIG. 1A), typically forming a gate metallization, is typically also arranged on the first surface 101 and insulated from the first metallization and the semiconductor body 40. Accordingly, the semiconductor device 100 may be operated as a three-terminal vertical semiconductor device.

The semiconductor body 40 typically includes a bulk mono-crystalline material 4 and at least one epitaxial layer 3a, 1 formed thereon. Using the epitaxial layer(s) 3a, 1 provides more freedom in tailoring the background doping of the material since the doping concentration can be adjusted during deposition of the epitaxial layer or layers.

In the exemplary embodiment illustrated in FIG. 1a, the semiconductor body 40 includes an n$^+$-type semiconductor region 4, which extends to (as far as) the second surface 102 and typically forms a drain region 4, and a first semiconductor region 1 in Ohmic contact with the drain region 4 and extending to the first surface 101. Further, the drain region 4 and the first semiconductor region 1 typically extend to the edge 41. The first semiconductor region 1 has a first maximum doping concentration of n-dopants which is typically lower than about $1*10^{14}$ cm$^{-3}$, more typically lower than about $5*10^{13}$ cm$^{-3}$ and may even be a substantially intrinsic semiconductor region (substantially un-doped).

In the exemplary embodiment illustrated in FIG. 1A, the drain region 4 and the first semiconductor region 1 are in Ohmic contact with each other via an n-type third semiconductor region 3a having a maximum doping concentration higher than the first maximum doping concentration and lower than a maximum doping concentration of the drain region 4. The third semiconductor region 3a may form a lowermost field-stop region.

As illustrated in FIG. 1A, the drain region 4 and the third semiconductor region 3a may be formed as respective layers Z4, Z5 which are substantially parallel to the first surface 101 and the second surface 102, respectively. Further, in a complete vertical cross-section, the drain region 4 and the third semiconductor region 3a typically extend between two edges 41 which are opposite to each other.

Different thereto, the first semiconductor region 1 typically extends through four further functional (substantially horizontally orientated) layers Z0 to Z3 which are arranged above the layer Z4 in reverse order and include further semiconductor regions.

In other embodiments, in which the drain metallization 11 is also arranged on the first surface 101 to form a lateral semiconductor device, the layers Z0 to Z5 may be at least partially curved.

When viewed from above, the semiconductor device 100 typically has an active area 110 having a plurality of unit cells for carrying and/or controlling a load current between the source metallization and the drain metallization 11, and a peripheral area 120 extending to the edge 41 and typically surrounding the active area 110. Further, the semiconductor device 100 typically includes a transition area 115 arranged between the active area 110 and the peripheral area 120.

In the exemplary embodiment illustrated in FIG. 1A, a plurality of spaced apart first n-type pillar regions 1a are formed in the active area 110. The first n-type pillar regions (first pillar regions of the first conductivity type) 1a are arranged in the functional layers Z0, Z1 and substantially extend to the first surface 101. Further, a plurality of p-type body regions 5, which are in Ohmic contact with the source metallization and spaced apart from each other by the first n-type pillar regions 1a interleaving with the p-type body regions 5, are formed in the uppermost functional layer Z0. A pn-junction is formed between each pair of adjoining body region 5 and first n-type pillar region 1a.

According to an embodiment, a plurality of first p-type pillar regions (first pillar regions of the second conductivity type) 6 adjoining a respective body region 5 are formed in the functional layer Z1. Typically, an integrated dopant concentration of the first n-type pillar regions 1a substantially matches an integrated dopant concentration of the first p-type pillar regions 6. Accordingly, a first charge-compensation structure 1a, 6 having, in the vertical cross-section, a plurality of alternating first n-type pillar regions 1a and first p-type pillar regions 6 in Ohmic contact with the source metallization are formed in the functional layer Z1 below the first surface 101. The first charge-compensation structure 1a, 6 is typically completely integrated in the semiconductor body 40 and spaced apart the first surface 101, respectively.

In the exemplary embodiment, the first p-type pillar regions 6 are formed as vertically orientated pillars. Alternatively, the first p-type pillar regions 6 may be formed as substantially vertically orientated strip-type parallelepipeds.

The first p-type pillar regions 6 are in low Ohmic contact with the source metallization. This is explained with regard to FIG. 2 illustrating an enlarged section of the functional zones Z0, Z1 in the active area 110 illustrated in FIG. 1 and the structures typically formed on the main horizontal surface 101. The illustrated section of FIG. 2 typically corresponds to one of a plurality of unit cells in an upper part of the semiconductor device 100.

In the exemplary embodiment, a p$^+$-type body contact region 5c and an n$^+$-type source region 15 are formed in the respective body region 5. Further, a p$^+$-type contact region 6c extends between the body contact region 5c and the first p-type pillar regions 6. The body contact regions 5c, the source regions 15 and the contact regions 6c are not shown in FIG. 1 and the following Figures for sake of clarity.

A dielectric region 13 is arranged on the first surface 101. A portion 13a of the dielectric region 13 is arranged between the main horizontal surface 101 and the gate electrode 12 which extends in a horizontal direction from the first n-type pillar region 1a forming a part of a drift region along the body region 5 at least to the source region 15 so that an inversion channel, which is also referred to herein as MOS-channel, may be formed by the field-effect in the body region 5 along portion 13a forming a gate dielectric region. Accordingly, the semiconductor device 100 may be operated as a MOSFET.

The remaining portion of the dielectric region 13 forms an interlayer dielectric between the source metallization 10 and the gate electrode 12 and first surface 101, respectively.

In the exemplary embodiment, the source metallization 10 electrically contacts the source region 15 and the body contact region 5c via a shallow trench contact formed through the interlayer dielectric 13 and into the semiconductor body. In other embodiments, the source metallization 10 electrically contacts the source region 15 and the body contact region 5c at the first surface 101.

According to another embodiment, the gate electrode 12 and gate dielectric 13a may be formed in a trench extending from the first surface 101 into the semiconductor body. In this embodiment, the body region 5 and source region 15 adjoin an upper part of the trench while the first n-type pillar region 1a adjoins a lower part of the trench. In this embodiment, the first n-type pillar region may not extend to the first surface 101 in the active area 110. Referring again to FIG. 1A, further embodiments are explained.

Typically, the first n-type pillar regions 1a and the first p-type pillar regions 6 are substantially depleted at a reverse voltage applied between the source metallization and the drain metallization 11 at a nominal reverse off-voltage $U_{off}$, which is lower than the rated breakdown voltage $U_{bd}$, typically less than about 70% of the rated breakdown voltage $U_{bd}$. For example, the nominal reverse off-voltage $U_{off}$ may be about 430 V for a rated blocking voltage $U_{bd}$ of 650 V.

According to an embodiment, an n-type first field-stop region 2 is in the active area 110 and arranged in a functional layer Z2 below the first charge-compensation structure 1a, 6. The first field-stop region 2 is in Ohmic contact with the drain metallization 11, adjoins the first n-type pillar regions 1a and the first p-type pillar regions 6, and has a doping concentration per area which is higher than the breakdown charge per area of the semiconductor material divided by the elementary charge. Accordingly, the first field-stop region 2 is not punched through when a reverse voltage higher than the nominal reverse off-voltage $U_{off}$ (and lower than the rated breakdown voltage $U_{bd}$) is applied between the drain metallization 11 and the source metallization. Thus, the first charge-compensation structure 1a, 6 is separated from a second charge-compensation structure integrated in the semiconductor body 40 and arranged in the active area 110 of a functional zone Z3 below the first charge-compensation structure 1a, 6.

The term "doping concentration per area" as used within this specification intends to describe a mathematically integrated concentration of dopants per volume along an electric field line (in a blocking mode) through a semiconductor region. In a vertical semiconductor device, the integral is typically obtained along a vertical line through the semiconductor region. Therefore, the term "doping concentration per area" typically corresponds to the term "doping concentration per horizontal area". Different thereto, the term "doping concentration" as such corresponds to a volume specific doping concentration (doping concentration per volume). The term "integrated doping concentration" as used within this specification intends to describe a volume integral of a concentration of dopants per volume.

Further, the term "breakdown charge per area" as used within this specification intends to describe the total charge per area $Q_c$ which is required for breakdown of the semiconductor material (avalanche multiplication). For example, the breakdown charge per area $Q_c$ is, depending on doping concentration, about $2*10^{12}$ elementary charges per $cm^2$ to about $3*10^{12}$ elementary charges per $cm^2$ for silicon, but may also be smaller for very low doping concentrations or higher for very high doping concentrations. When a semiconductor region forming a pn-junction with a further semiconductor region has, in a direction towards the pn-junction, a doping concentration per area higher than the breakdown charge per area $Q_c$ of the semiconductor material, the semiconductor region cannot be completely depleted in this direction by reversely biasing the pn-junction without reaching the breakdown field strength in the semiconductor region. Different thereto, a semiconductor region having, in the direction, a doping concentration per area lower than the breakdown charge per area $Q_c$ of the semiconductor material may be completely depleted (and punched-through) in the direction without reaching the breakdown field strength of the semiconductor material. The wording that a semiconductor region has a doping concentration per area higher than a breakdown charge per area of the semiconductor material divided by the elementary charge intends to describe that the semiconductor region cannot be completely depleted without reaching the breakdown field strength in the semiconductor region. Likewise, the wording that a semiconductor region has a doping concentration per area lower than the breakdown charge per area of the semiconductor material divided by the elementary charge intends to describe that the semiconductor region can be completely or at least substantially depleted without reaching the breakdown field strength in the semiconductor region.

As illustrated in FIG. 1B corresponding to a vertical cross-section through the semiconductor device 100 along line B' of FIG. 1A which is substantially perpendicular to the drawing of FIG. 1A, the second charge-compensation structure may include second n-type pillar regions 3 which adjoin the first field-stop region 2 and alternate with second p-type pillar regions 6a, which are typically floating semiconductor regions. Typically, an integrated dopant concentration of the second n-type pillar regions 3 substantially matches an integrated dopant concentration of the second p-type pillar regions 6a.

According to an embodiment, the doping concentrations of the first n-type pillar regions 1a and the first p-type pillar regions 6 as well as the doping concentrations of the second n-type pillar regions 3 and the second p-type pillar regions 6a are chosen such that, in the off-state (when the voltage of the drain metallization 11 is higher than the voltage of the source metallization), their charges in the respective functional zones Z1 and Z3 can be mutually depleted and that, in the on-state, an uninterrupted, low-resistive conduction path is formed from the source metallization to the drain metallization 11.

Figure 3A:
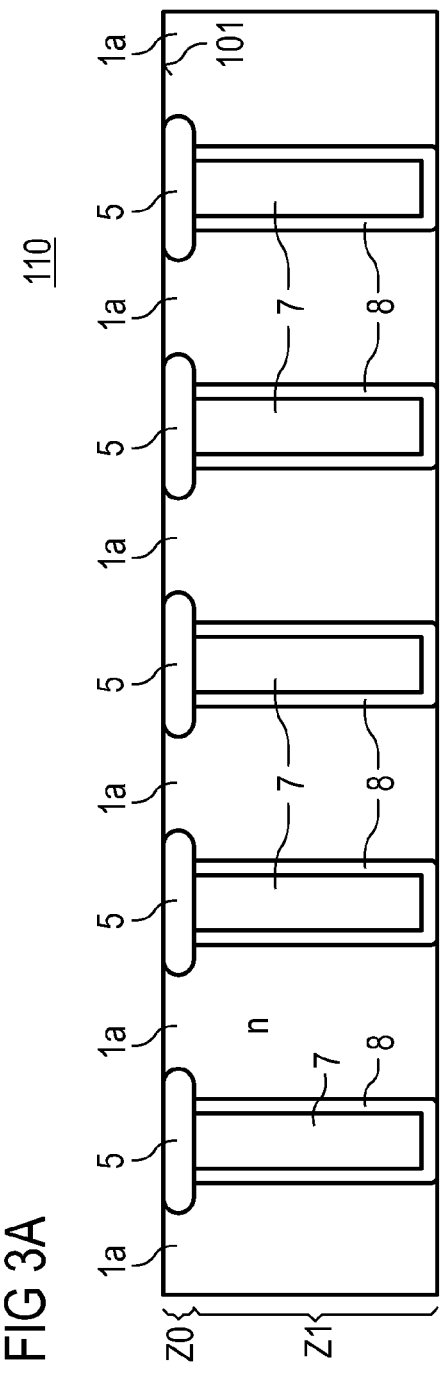
FIG. 3A illustrates a vertical cross-section through a semiconductor body of a semiconductor device according to an embodiment.

In another embodiment, the first charge-compensation structure is, in the functional zone Z1, not implemented as a superjunction charge-compensation structure but as a so called field-plate or field-electrode charge-compensation structure as illustrated in FIG. 3A. In this embodiment, the first charge-compensation structure has, in the vertical cross-section, a plurality of trench field-electrodes 7 which alternate with the first n-type pillar regions 1a. Each of the trench field-electrodes 7 is implemented in a vertical trench which may substantially extend through the functional layer Z1. Respective field-dielectric regions 8 are arranged at the bottom and side walls of the vertical trenches to separate the respective field-electrodes 7 from the adjacent first n-type pillar regions 1a. Typically, the field-electrodes 7 are in Ohmic contact with the source metallization via respective body regions 5 arranged on the field-electrodes 7.

Figure 3B:
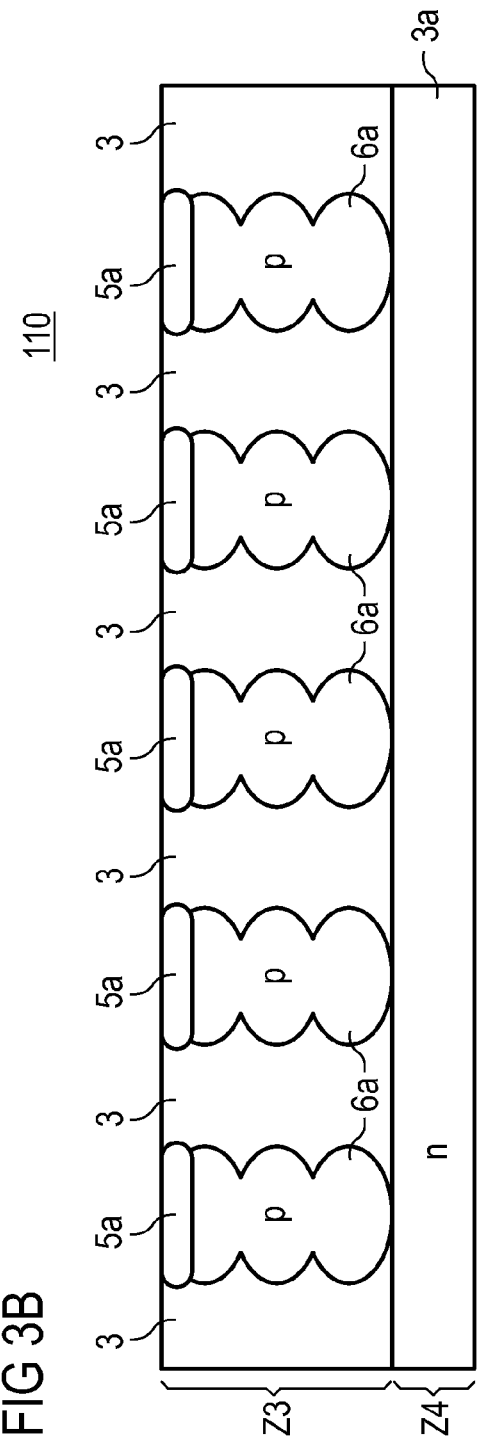
FIG. 3B illustrates a vertical cross-section through a semiconductor body of a semiconductor device according to an embodiment.

According to embodiments, the first p-type pillar regions 6 and/or the second p-type pillar regions 6, 6a are, in the vertical cross-section, substantially formed as a respective column of contiguous bubbles as illustrated in FIG. 2 and FIG. 3B, respectively. Referring again to FIG. 1A, further embodiments are explained.

According to an embodiment, a floating p-type body region 5a forming a pn-junction with the first field-stop region 2 extends from the active area 110 into the transition area 115. Further, a p-type semiconductor region 5', 5" arranged next to the main horizontal surface 101 and in Ohmic contact with the source metallization, and an n-type second field-stop region 2a adjoining the first field-stop region 2 and the first semiconductor region 1 are arranged in the transition area 115 to form a punch-through structure which is connected in parallel with the first charge-compensation structure between the source metallization 10 and the second charge-compensation structure. Therefore, the transition area 115 is also referred to as punch-through area 115.

In the punch-through area 115, the p-type semiconductor region 5', 5", the first semiconductor region 1, the second field-stop region 2a and the floating p-type body region 5a overlapping with each other when viewed from above. In the following, the p-type semiconductor region 5', 5" is also referred to as further body region. To form a punch-through structure, the second field-stop region 2a has a doping concentration (of n-type dopants) per horizontal area lower than the breakdown charge per area $Q_C$ of the semiconductor material divided by the elementary charge. Accordingly, the second field-stop region 2a may be punched through in the off-state.

Different thereto, the doping concentration (of p-type dopants) per horizontal area of the floating body region 5a is higher than the breakdown charge per area $Q_C$ of the semiconductor material divided by the elementary charge.

Furthermore, the doping concentration (of n-type dopants) per horizontal area of the first field-stop region 2 in the active area 110 is typically about two times or at least about two times the breakdown charge per area $Q_C$ of the semiconductor material divided by the elementary charge as the first field-stop region 2 may be partly depleted in the off-state from the pn-junction formed with the floating body region 5a and from the pn-junction formed with the first p-type pillar regions 6 and the p-body regions 5 respectively.

Compared to vertical charge-compensation MOSFETs having two charge-compensation structures and a field-stop region which is arranged therebetween and has a doping concentration (of n-type dopants) per horizontal area lower than Qc divided by the elementary charge, for example about two thirds of the breakdown charge per area $Q_c$ of the used semiconductor material divided by the elementary charge, the punch-through voltage $U_{Pu}$ of semiconductor device 100 may be better adjusted as the process-variations related to the manufacturing of the first charge-compensation structures do not contribute to $U_{Pu}$ of the semiconductor device 100. Accordingly, the punch-through voltage $U_{Pu}$ may be set closer to the nominal reverse off-voltage $U_{off}$ of an application circuitry. Accordingly, the output charge $Q_{OSS}$ and/or the electric energy $E_{OSS}$ of the semiconductor device 100 may be reduced compared to vertical charge-compensation MOSFETs having two charge-compensation structures and a depletable field-stop region arranged between the two charge-compensation structures.

Typically, the punch-through voltage $U_{Pu}$ is in a range from about the nominal reverse off-voltage $U_{off}$ to about a minimum blocking voltage $U_{Z1,ZF}$ of the active area 110. The punch-through voltage $U_{Pu}$ may substantially match the nominal reverse off-voltage $U_{off}$ but may also be a bit larger, for example a few percent, to take into account processing variations.

According to an embodiment, the first semiconductor region 1 of the semiconductor device 100 is substantially un-doped (intrinsic). In this embodiment, the punch-through voltage $U_{Pu}$ is given by the punch-through field strength $E_{Pu}$ times the vertical extension $d_{Z1}$ of the first semiconductor region 1 and the functional zone Z1, respectively, and may be determined by:

$$U_{pu} = E_{pu} \cdot d_{z1} = d_{z1} \cdot \frac{E_c}{Q_c} \cdot Q_{pu} = d_{z1} \cdot \frac{\varepsilon_0 \varepsilon_r}{e} \cdot Q_{pu}$$

with the $E_C$, $Q_{Pu}$, e, $\varepsilon_0$ and $\varepsilon_r$ denoting the critical field strength, the doping concentration per horizontal area of the second field-stop region 2a, the elementary charge, the vacuum permittivity and the relative permittivity of the semiconductor material (about 12 for silicon), respectively.

Setting $U_{Pu}$ equal to $U_{off}$ results in:

$$Q_{pu} = \frac{U_{off}}{d_{z1}} \cdot \frac{\varepsilon_0 \varepsilon_r}{e}$$

for the doping concentration per horizontal area of the second field-stop region 2a.

The nominal reverse off-voltage $U_{off}$ is given by the application. The vertical extension $d_{Z1}$ may be precisely controlled during manufacturing. Accordingly, the punch-through voltage $U_{Pu}$ may be precisely adjusted. For a typical nominal reverse off-voltage $U_{off}$ of 420 V and a typical vertical extension $d_{Z1}$ of 30 μm, a doping concentration per horizontal area $Q_{Pu}$ of the second field-stop region 2a of about $9.1*10^{11}$ cm$^{-2}$ is obtained which may be used as implanting dose for forming the second field-stop region 2a in an intrinsic semiconductor material during manufacturing.

According to an embodiment, the first field-stop region 2 and the second field-stop region 2a extend between two horizontal layers and form at least a part of a contiguous embedded field-stop zone. In the following, the first field-stop region 2 and the second field-stop region 2a are also referred to as first embedded field-stop region 2 and second embedded field-stop region 2a, respectively.

According to an embodiment, the doping concentration of the first field-stop region 2 is chosen such that the diode structure formed between the floating body region 5a and the n-type first field-stop region 2 has a breakdown voltage which is higher than the voltage drop across a substantially depleted second charge compensation structure 3, 6a.

During the on-state (the voltage $V_S$ of the source metallization is smaller than the voltage $V_D$ of the drain metallization 11, and the voltage $V_G$ of the gate electrodes is higher than $V_S$ so that a conductive channel is formed in the body regions 5), a normal electron current flows through the MOSFET 100 between the source metallization and the drain metallization 11. For this purpose, the MOSFET 100 typically further includes an n-type first semiconductor layer 3a arranged in the functional layer Z4 and an n-type drain layer 4 arranged in the functional layer Z5. The first semiconductor layer 3a and the drain layer 4 typically extend to the edge 41, more typically extend between two edges 41 in a complete vertical cross-section to form the functional layer Z4 and the functional layer Z5, respectively. Typically, the first semiconductor layer 3a adjoins the first semiconductor region 1, has a maximum doping concentration higher than the first semiconductor region 1, and is in the active area 110 arranged between the second charge-compensation structure 3, 6a and the drain metallization 11. The first semiconductor layer 3a may adjoin the second n-type pillar regions 3. The drain layer 4 typically adjoins the first semiconductor layer 3a and has a maximum doping concentration higher than the first semiconductor layer 3a to form an Ohmic contact with the drain metallization 11.

The first p-type pillar regions 6 and the first n-type pillar regions 1a may be substantially bar-shaped or ring-shaped when viewed from above. Alternatively, the first p-type pillar regions 6 may form one contiguous region and the first n-type pillar regions 1a may be embedded in the contiguous region 6 and shaped as circles, ellipsoids or polygons, for example hexagons, when viewed from above. Alternatively, the first n-type pillar regions 1a may form one contiguous region and the first p-type pillar regions 6 may be embedded in the contiguous region 1a and shaped as circles, ellipsoids or polygons, for example hexagons, when viewed from above.

The second p-type pillar regions 6a and the second n-type pillar regions 3 may substantially bar-shaped or ring-shaped when viewed from above. Alternatively, the second p-type pillar regions 6a may form one contiguous region and the second n-type pillar regions 3 may be embedded in the contiguous region 6a and shaped as circles, ellipsoids or polygons, for example hexagons, when viewed from above. Alternatively, the second n-type pillar regions 3 may form one contiguous region and the second p-type pillar regions 6a may be embedded in the contiguous region 3a and shaped as circles, ellipsoids or polygons, for example hexagons, when viewed from above.

As illustrated in FIGS. 1A, 1B and in FIG. 4, which corresponds to a layout and a horizontal cross-section through the semiconductor body 40 illustrated in FIG. 1A along the dashed-dotted line C', each of the floating second p-type pillar regions 6a adjoins the floating p-type body region 5a which is typically a contiguous semiconductor region when viewed from above. Note that the drawings of FIG. 1A and FIG. 1B typically correspond to a section along the dashed-dotted line D' in FIG. 4 and along the dashed-dotted line E' in FIG. 4, respectively. Typically, the floating p-type body region 5a has a higher maximum doping concentration than the second p-type pillar regions 6a to ensure a low Ohmic contact.

During the off-state (blocking-mode) and if the reverse voltage $U_r$ is lower than nominal reverse off-voltage $U_{off}$ and the punch-through voltage $U_{Pu}$, respectively, the reverse voltage substantially drops across the first charge-compensation structure 1a, 6 and the functional zone Z1, respectively. Accordingly, the stored charge $Q_{OSS}$ and switching losses may at given on-resistance $R_{on}$ and rated breakdown voltage $U_{bd}$ be reduced compared to conventional compensation MOSFETs as only the functional zone Z1 is depleted under normal reverse operational conditions. The $Q_{OSS}$-reduction may be estimated as $(1-U_{Z1,ZF}/U_{bd})$ and amount to up to about 30%.

If the reverse voltage $U_r$ exceeds the punch-through voltage $U_{Pu}$, for example due to a rare voltage spike ($U_r=U_{peak}$), the second field-stop region 2a is punched through and the formed space charge region reaches the floating body region 5a which is only partially depletable and thus forms an equipotential region which transmits the potential to the second charge-compensation structure 3, 6a which is depleted accordingly. Accordingly, $U_{peak}-U_{pu}$ substantially drops across the second charge-compensation structure 3, 6a and the functional zone Z3, respectively.

When the semiconductor device 100 is subsequently switched to forward current mode, the floating p-type body region 5a and the floating second p-type type pillar regions 6a may still be charged. Accordingly, the on-resistance $R_{on}$ may be increased. Through-punching of the second field-stop region 2a happens however only in rare events and the floating p-type body region 5a and the floating second p-type type pillar regions 6 are recharged in subsequent switching cycles with thermally generated charge carriers. Accordingly, the time-averaged on-resistance $R_{on}$ is at most only slightly increased while the switching losses are significantly reduced compared to conventional compensation MOSFETs.

Since reverse voltages $U_r$ above nominal reverse off-voltage $U_{off}$ are rare, the overall switching-losses of the semiconductor device 100 are typically lower compared to conventional compensation MOSFETs of same on-state resistance $R_{on}$. In other words, the trade-off between switching losses and forward current losses is improved. Furthermore, if the MOSFET 100 is used as a switch in a so called soft-switching or zero-voltage-switching application, for example for driving an electric motor using a resonant tank formed as an LLC-circuit, the body diodes are regularly forwardly biased such that the semiconductor body 40 is flooded with electrons and holes. Accordingly, the floating p-type body region 5a and the floating second p-type type pillar regions 6 may discharged again regularly, for example in each switching cycle. Thus, Ron remains substantially unchanged in these applications and the trade-off between forward current losses and switching losses is improved compared to using conventional compensation MOSFETs.

Even further, the trade-off between forward current losses and switching losses is also improved compared to vertical charge-compensation MOSFETs having two charge-compensation structures and a field-stop region which is arranged between the two charge-compensation structures and punched-through during reverse peak voltages. This is because the punch-through voltage $V_{PU}$ is better adjustable in the punch through area 115 of the MOSFET 100 as explained above.

To achieve high breakdown voltages $U_{bd}$ and/or for reducing a leakage current, an edge-termination structure may be used in the peripheral area 120 surrounding the active area 110 with active MOSFET-cells and the punch-through area 115.

In the exemplary embodiment illustrated in FIG. 1A, the edge-termination structure is implemented as an n-type channel-stop region 9 which adjoins the first semiconductor region 1, has a maximum doping concentration higher than the first maximum doping concentration of the first semiconductor region 1 and extends to the edge 41 and the main horizontal surface 101.

The edge-termination structure may also include a VLD (Variation of Lateral Doping)-structure, field plates, floating guard rings or the like.

Furthermore, the p-type semiconductor region 5', 5" typically has a first p-type portion 5' and an second p-type portion 5" which is closer to the peripheral area 120 and the edge 41, respectively, and has a lower maximum doping concentration than the first p-type portion 5'.

FIG. 5A illustrates a vertical cross-section through a charge-compensation semiconductor device 200. The semiconductor device 200 is similar to the semiconductor device 100 explained above with regard to FIGS. 1A to 4 and may also be operated as a vertical MOSFET. Further, the punch-through area 115 and the peripheral area 120 are similar as explained above for the semiconductor device 100. Note that the vertical cross-section illustrated in FIG. 5B may correspond to a perpendicular section along the line A' shown in FIG. 1A and the line A' shown in FIG. 5A.

However, each of the second p-type pillar regions 6a of the semiconductor device 200 is arranged vertically below and substantially centered with regard to a respective first p-type pillar regions 6, and each of the second n-type pillar regions 3 is arranged vertically below and substantially centered with regard to a respective first n-type pillar regions 1a. Accordingly, the first p-type pillar regions 6 and the second p-type pillar regions 6a may substantially overlap with each other when viewed from above. This applies also to the first n-type pillar regions 1a and the second n-type pillar regions 3. When viewed from above, the first and second p-type pillar regions 6, 6a as well as the first and second n-type pillar regions 1a, 3 are typically bar-shaped and orientated substantially parallel to each other or ring-shaped. In other embodiments, the first p-type pillar regions 6 and the second p-type pillar regions 6a are bar-shaped and angled with respect to each other. Further, the first p-type pillar regions 6 and the second p-type pillar regions 6a may be off-set. Furthermore, the pitch of the first p-type pillar regions 6 and the second p-type pillar regions 6a may differ.

As illustrated FIG. 6, which corresponds to a layout and a horizontal cross-section through the semiconductor body 40 of semiconductor device 200 illustrated in FIG. 5A along the dashed-dotted line C', less, for example only one or two bar-shaped portions (contact fingers for the second p-type pillar regions 6) 5a' are used in the active area 110. This facilitates manufacturing of the semiconductor device 200 since this layout is, due to the larger spacing between the contact fingers 5a', less susceptible to later thermal processes.

Typically, the pitch of the contact fingers 5a' is larger than the pitch of the second charge-compensation structure 3, 6a, for example by a factor of at least about two or even five or ten. This also reduces Ron compared to layouts with the same pitch of contact fingers 5a' and the second charge-compensation structure 3a, 6a (second p-type pillar regions 6a) as illustrated in FIG. 4.

The floating body region 5a is typically used for contacting the second p-type pillar regions 6a and transferring the punch-trough voltage to the second p-type pillar regions 6a as well as for providing counter charges to the drain region 4 and the drain electrode 11, respectively.

According to an embodiment, the semiconductor body has in the active area 110 a first charge-compensation structure 1a, 6, and a second charge-compensation structure 3, 6a which are separated from each other at least by the n-type first field-stop region 2 having a doping concentration per area higher than the breakdown charge per area $Q_c$ of the semiconductor material divided by the elementary charge. The first charge-compensation structure 1a, 6 includes in a first vertical cross-section which is substantially perpendicular to the main horizontal surface 101, a plurality of alternating first p-type pillar regions 6 and first n-type pillar regions 1a. The second charge-compensation structure 3, 6a is integrated in the semiconductor body 40 and includes, either in the first vertical cross-section (as for the semiconductor device 100) or (as for the semiconductor device 200) in a second vertical cross-section which is substantially perpendicular to the main horizontal surface 101 and the first vertical cross-section, a plurality of alternating second p-type pillar regions 6a and second n-type pillar regions 3.

FIG. 7A illustrates a vertical cross-section through a charge-compensation semiconductor device 300. The semiconductor device 300 is similar to the semiconductor device 200 explained above with regard to FIGS. 5A to 6 and may also be operated as a vertical MOSFET. However, the punch-trough area 115 of the semiconductor device 300 additionally includes an integrated discharging structure for the second p-type pillar regions 6a and the floating body region 5a, respectively.

In the exemplary embodiment, the integrated discharging structure is implemented as a highly doped diode 2c, 5e forming an avalanche charge-generating structure (avalanche or Zener diode) which is arranged above and in Ohmic contact with the second charge-compensation structure 3, 6a.

As illustrated in FIG. 7A and FIG. 7B illustrating a cross-section along line F' of FIG. 7A, a n-type cathode region 2c forming a pn-junction 25 with an adjoining portion 5e of the floating body region 5a may be arranged in a portion of the second field-stop region 2a. The adjoining portion 5e of the floating body region 5a may have an even higher maximum doping concentration than other portions of the floating body region 5a and is in the following also referred to as anode portion 5e. The cathode region 2c has typically a maximum doping concentration which is higher than the maximum doping concentration of the second field-stop region 2a. The pn-junction 25 is typically a $p^{++}/n^{++}$-junction. For example, the maximum doping concentration of the cathode region 2c (and the anode portion 5e) is typically larger than $10^{17}$ cm$^{-3}$, more typically larger than $10^{18}$ cm$^{-3}$, and even more typically larger than $10^{19}$ cm$^{-3}$ or even $10^{20}$ cm$^{-3}$.) The n-dopants of the cathode region 2c are typically arsenic.

When the second field-stop region 2a is punched-trough in an off-state of the semiconductor device 300 ($U_r=U_{peak}$), the second p-type pillar regions 6a are charged. After switching the semiconductor device 300 into an on-state with open channels, electrons start, due to the channel current, to drift into the functional zone Z3 after discharging the first charge-compensation structure 1a, 6. Accordingly, the voltage drop between the source metallization and the drain metallization drops below the value $U_{peak}-U_{Pu}$ corresponding to the stored voltage in the second charge-compensation structure 6a, 3 during the off-state. This is accompanied by a reorganization of the charges in the functional zone Z3. During the reorganization of the charges in the functional zone Z3, the pn-junction 25 is switched from the forward direction into the reverse direction. Accordingly, a space charge region is formed at the pn-junction 25. The voltage drop $U_{25}$ across the space charge region corresponds to (matches) and thus follows the voltage drop which is due to the channel current. When the voltage drop $U_{25}$ exceeds a breakdown voltage $U_{Bd25}$ of the corresponding diode 5a, 5e, electron-hole pairs are formed and separated in the electric field. This results in a discharging of the second p-type pillar regions 6a and the floating body region 5a and a corresponding reduction of the space-charge region in the second charge-compensation structure 6a, 3 and the functional zone Z3, respectively. This mechanism yields a substantial partial discharging as the space-charge region can only be reduced to a size corresponding to the breakdown voltage $U_{Bd25}$ of the diode structure. However, the $R_{on}$-increase compared to a completely discharged second charge-compensation structure 6a, 3 is typically small and will further be reduced in subsequent switching cycles, e.g. due to thermally generated charge carriers. Furthermore, this process may be enhanced by charge generation centers (for example platinum in silicon) integrated in the second charge-compensation structure 6a, 3 and the functional zone Z3, respectively. For a vertically orientated planar pn-junction 25 with equal doping concentration D in the cathode region 2c and the anode portion 5e, the breakdown voltage $U_{Bd25}$ can be estimated as $$U_{Bd25} = \frac{\varepsilon_r \cdot \varepsilon_0}{e \cdot D} \cdot E_c^2$$

For silicon and a doping concentration D of $10^{18}$ cm$^{-3}$, the breakdown field strength $E_C$ is about 8 $10^7$ V/m. This results in a breakdown voltage $U_{Bd25}$ of about 4V already at a doping concentration D of $10^{18}$ cm$^{-3}$. Furthermore, the breakdown voltage $U_{Bd25}$ will be lower for curved pn-junction 25. Accordingly, breakdown voltage $U_{Bd25}$ of less than about 2 V may be achieved.

The remaining temporary Ron-increased due to the residual voltage drop ($U_{Bd25}$) in the second charge-compensation structure 3, 6a is therefore small and thus tolerable. Note that the temporary Ron-increased is a rare event only. Therefore, discharging of the second charge-compensation structure 3, 6a by switching the body diodes regularly into the forward mode is not required. Thus, the MOSFET 300 may also be used in hard-switching applications with improved trade-off between forward current losses and switching losses.

Typically, the Avalanche (or Zener) discharging structure is an integral part of the embedded field-stop zone 2a, 2b, 2c.

Typically, the anode portion 5e and the cathode region 2c substantially overlap with each other when viewed from above. Further, at least the cathode region 2c typically overlaps with the second p-type portion 5" when viewed from above.

When viewed from above, the anode portion 5e and the cathode region 2c may be bar-shaped or ring-shaped or shaped as ellipsoids, polygons or the like. Further, the anode portion 5e and the cathode region 2c may only be formed in a portion of the punch-through area when viewed from above.

FIG. 8 illustrates a vertical cross-section through a charge-compensation semiconductor device 400. The semiconductor device 400 is similar to the semiconductor device 300 explained above with regard to FIGS. 7A, 7B and may also be operated as a vertical MOSFET. Further, the semiconductor device 400 also has a charge-generating structure 51 for discharging the floating second p-type pillar regions 6a. However, the charge-generating structure (discharging structure 51) is not integrated in the punch-through area 115 of semiconductor body 40, but arranged on the main horizontal surface 101 in the peripheral area 120. The charge-generating structure 51 may be arranged at the main horizontal surface 101 but also at least partly below the main horizontal surface 101. Due to arranging the charge-generating structure 51 next to the main horizontal surface 101, the manufacturing of the semiconductor device 400 is facilitated compared to the semiconductor device 300 explained above with regard to FIGS. 7A, 7B. This is because the charge-generating structure 51 is manufactured in a late manufacturing stage, typically after manufacturing the second charge-compensation structure 3, 6a, more typically after manufacturing the second charge-compensation structure 3, 6a and the first charge-compensation structure 1a, 6. Accordingly, the charge-generating structure 51 is typically at most exposed to low thermal budgets. Thus, out-diffusing of highly doped semiconductor regions of the charge-generating structure is less likely. Furthermore, more complicated discharging structure or even discharging circuits enabling even lower residual voltages drops may be provided next to the main horizontal surface 101 without affecting the processing of the structures in the active area 110 of the semiconductor device 400. Examples for more complicated discharging structure are explained below with regard to FIGS. 9A to 10B.

In the exemplary embodiment illustrated in FIG. 8, the charge-generating structure 51 is implemented as a metal layer 51 which is arranged on the main horizontal surface 101 and forms an abutting contact with an n-type first equipotential semiconductor region 52 and a p-type second equipotential semiconductor region 53 which are both embedded in the first semiconductor region 1 and extend to the main horizontal surface 101 in the peripheral area 120.

To enable the discharging of the floating second p-type pillar regions 6a and the floating body region 5a after a reverse overvoltage event, the charge-generating structure (discharging structure) 51 has to be connected to the embedded floating body region 5a and the embedded field-stop regions 2, 2a. This is done via the second equipotential semiconductor region 53 extending to the floating body region 5a, and via the first equipotential semiconductor region 52, respectively. In the exemplary embodiment, the first equipotential semiconductor region 52 extends to an optional third field-stop region 2b forming an extension portion of the embedded field-stop zone 2, 2a, 2b. The third field-stop region 2b may also be arranged completely in functional layer Z2 and typically forms a pn-junction with the floating body region 5a.

To ensure a space-saving design, the second equipotential semiconductor region 53 is typically arranged between the first equipotential semiconductor region 52 and the edge 41. Still, the first equipotential semiconductor region 52 and the second equipotential semiconductor region 53 require some chip area. However, in order to ensure a low Ohmic contact, the maximum doping concentrations of the first equipotential semiconductor region 52 and the second equipotential semiconductor region 53 are typically larger than $10^{17}$ cm$^{-3}$, more typically larger than $10^{18}$ cm$^{-3}$. Thus, the potential drop in the first equipotential semiconductor region 52 and the second equipotential semiconductor region 53 is negligible (orders of magnitude lower than the potential drop across the semiconductor body 40). For this reason the first equipotential semiconductor region 52 and the second equipotential semiconductor region 53 are equipotential regions at given voltage drop between the source metallization and the drain metallization 11, and may act as field plates 52, 53. As illustrated in FIG. 8, the equipotential semiconductor region 52, 53 and the additional n-type third equipotential semiconductor region 3b, which is embedded in the first semiconductor region 1, extends from the first semiconductor layer 3 substantially to the main horizontal surface 101, and is arranged between the second equipotential semiconductor region 53 and the edge 41, form "vertical" extensions of horizontally orientated structures in the active area 110 and the punch-through area 115 of semiconductor device 400. Thus, appropriately shaped first and second equipotential semiconductor regions 52, 53 may form part of an edge-termination structure which is typically anyways used in the peripheral area 120 of vertical power semiconductor devices. Accordingly, no additional chip area may be required. Furthermore, it turns out that the edge-termination structure with the first equipotential semiconductor region 52 and the second equipotential semiconductor region 53 may be very compact and thus even result in saving chip area and costs, respectively.

For example, the equipotential semiconductor regions 52, 53, 3b may, in the vertical cross-section, follow (cover) respective curves, for example respective sections of a circle around a point in the p-type semiconductor region 5', 5" but may also be substantially bar-shaped. The exact curves depend on the semiconductor device and may be determined using device simulation.

The illustrated edge-termination structure may also be used for other power semiconductor devices. According to an embodiment, the semiconductor body 40 includes in the peripheral area 120 a first semiconductor region 1 having a first maximum doping concentration of n-type dopants, an n-type embedded field-stop zone extending into the active area 110 with a plurality of unit cell, for example MOSFET-cells, a floating body region 5a arranged below the n-type embedded field-stop zone and extending into the active area 110, an n-type first equipotential semiconductor region 52 and a p-type second equipotential semiconductor region 53. In a vertical cross-section the first n-type equipotential semiconductor region 52 and the second p-type equipotential semiconductor region 53 are embedded in the first semiconductor region 1, which is in Ohmic contact with the drain metallization 11 and substantially extends to at least one of the main horizontal surface 101 and the edge 41. The embedded field-stop zone adjoins the first semiconductor region 1, has a maximum doping concentration higher than the first maximum doping concentration, and is in Ohmic contact with the drain metallization 11. The floating body region 5a is arranged between the embedded field-stop zone 2, 2a, 2b and the drain metallization 11, and forms a pn-junction with the embedded field-stop zone. The first equipotential semiconductor region 52 extends from the embedded field-stop region 2, 2a, 2b substantially to the main horizontal surface 101. The second equipotential semiconductor region 53 extends from the floating body region 5a substantially to the main horizontal surface 101, and is arranged between the first equipotential semiconductor region 52 and the edge 41.

Typically, a first semiconductor layer 3a extends from the active area 110 to the edge 41, adjoins the first semiconductor region 1, has a maximum doping concentration higher than the first maximum doping concentration, and is arranged between the first semiconductor region 1 and the drain metallization 11.

Furthermore, an n-type third equipotential semiconductor region 3b is embedded in the first semiconductor region 1, has a maximum doping concentration higher than the first maximum doping concentration, extends from the first semiconductor layer 3a substantially to the main horizontal surface 101 and is arranged between the second equipotential semiconductor region 53 and the edge 41.

The equipotential semiconductor region 52, 53, 3b may be substantially bar-shaped or ring-shaped when viewed from above.

In embodiments, in which the active are 110 includes a first and a second compensation structure, the floating body region 5a and the embedded field-stop zone 2, 2a, 2b are typically arranged between the first and a second compensation structures, and the first and second equipotential semiconductor regions 52, 53 are in contact with a charge-generating structure (discharging structure) 51 arranged nest to the main horizontal surface 101.

In the exemplary embodiment illustrated in FIG. 8, the charge-generating structure is formed by metal layer 51 forming at the main horizontal surface 101 an abutting contact with the first equipotential semiconductor region 52 and the second equipotential semiconductor region 53. The metal layer 51 is typically made of a metal such as wolfram or another material such as a silicide having a Fermi-level which lies in the conduction band. Accordingly, a high charge generation rate is obtained when the charge-generating structure is exposed to a voltage drop. Thus, the floating p-type pillar regions 6a of the second charge-compensation structure may be efficiently discharged after a reverse overvoltage event.

Alternatively, a semiconductor region, which includes lattice defects and/or deep traps is arranged next to the main horizontal surface 101, for example at and/or on the main horizontal surface 101, and is in Ohmic contact with the first equipotential semiconductor region 52 and the second equipotential semiconductor region 53, may be used as charge-generating structure. For example a poly-silicon region or a semiconductor region with lattice defects or a silicon region with deep traps (Au, Cu or Pt) may be used.

Alternatively, a dielectric region may be arranged next to the main horizontal surface 101, for example on the main horizontal surface 101, and extend between the first equipotential semiconductor region 52 and the second equipotential semiconductor region 53, wherein the first semiconductor region 1 includes next to an interface formed with the dielectric region lattice defects and deep traps that can be operated to generate electron-hole pairs.

The charge-generating structure may be substantially bar-shaped or ring-shaped when viewed from above.

Figure 9B:
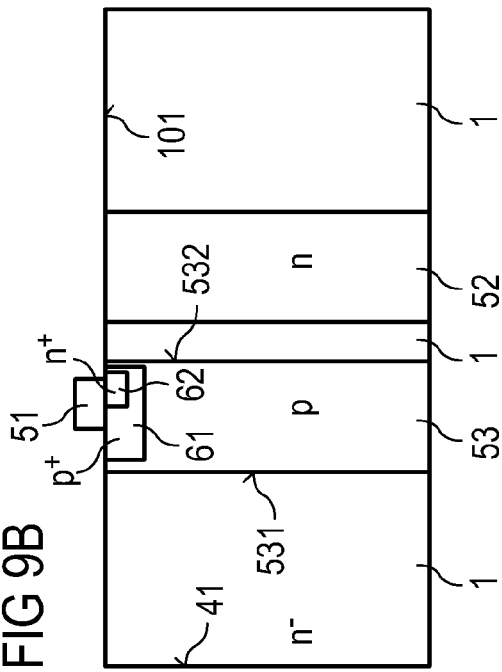
FIG. 9B illustrates a vertical cross-section through a peripheral area of a semiconductor device according to an embodiment.
Figure 9D:
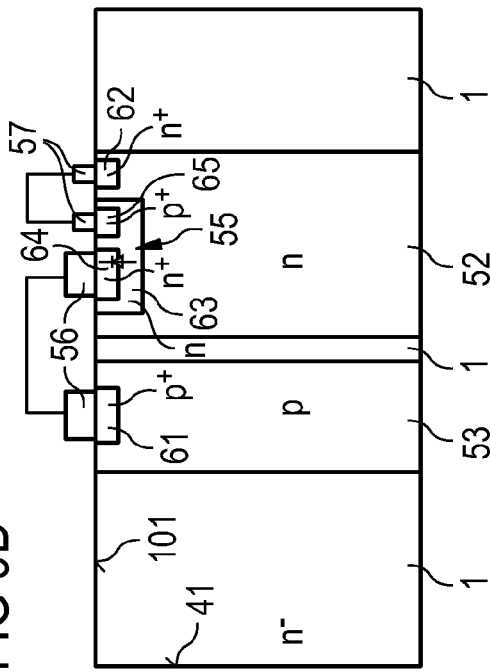
FIG. 9D illustrates a vertical cross-section through a peripheral area of a semiconductor device according to an embodiment.
Figure 9A:
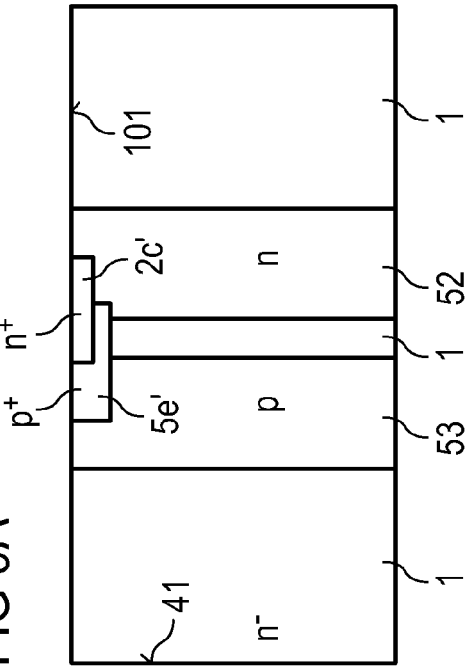
FIG. 9A illustrates a vertical cross-section through a peripheral area of a semiconductor body of a semiconductor device according to an embodiment.

FIG. 9A illustrates an embodiment where an avalanche or zener diode 5e', 2c' may be used as charge-generating structure. The function of the avalanche diode is similar as previously explained for the avalanche diode 5e, 2c'. However, the highly n-doped cathode region 2c' and the highly p-doped anode region 5e' are formed in the peripheral area of the semiconductor device illustrated in FIG. 9A. FIG. 9A and the following Figures typically correspond to a respective upper left section of a vertical cross-section as illustrated in FIG. 8. For sake of clarity, the optional third equipotential semiconductor region is not shown in these Figures. Further, the first and second equipotential semiconductor regions 52, 53 are drawn as rectangles in FIG. 9A to 10B but may also form respective curved interfaces with the first semiconductor region 1.

FIG. 9B illustrates a reverse punching structure that may be used as a discharging structure. In the exemplary embodiment, a highly n-doped semiconductor region 62 is arranged asymmetrically in an optional highly p-doped portion 61 of the second equipotential semiconductor region 53 arranged at the main horizontal surface 101, and a metal layer 51 forms an abutting contact with the semiconductor regions 61, 62 is arranged on the main horizontal surface 101.

According to an embodiment, the n-doped semiconductor region 62 is arranged closer to a pn-junction 532 formed between the second equipotential semiconductor regions 53 and the portion 1 of the first semiconductor region 1, which is arranged between the first equipotential semiconductor region 52 and the second equipotential semiconductor region 53, than to a pn-junction 531 formed between the second equipotential semiconductor regions 53 and the portion 1 of the first semiconductor region 1 arranged between the second equipotential semiconductor region 53 and the edge 41.

In the off-state, a space charge region at the pn-junction 351 extends into the second equipotential semiconductor region 53, but without reaching the semiconductor region 62. After switching the semiconductor device into the on-state again, the second equipotential semiconductor region 53 may be negatively charged with respect to the first semiconductor region 1 as explained above with regard to FIGS. 7 and 8. In this event, a space charge region at the pn-junction 352 may reach the semiconductor region 62. Due to the abutting contact, a hole current may be generated which result in discharging of the second equipotential semiconductor region 53 and the floating p-type regions connected thereto.

Figure 9C:
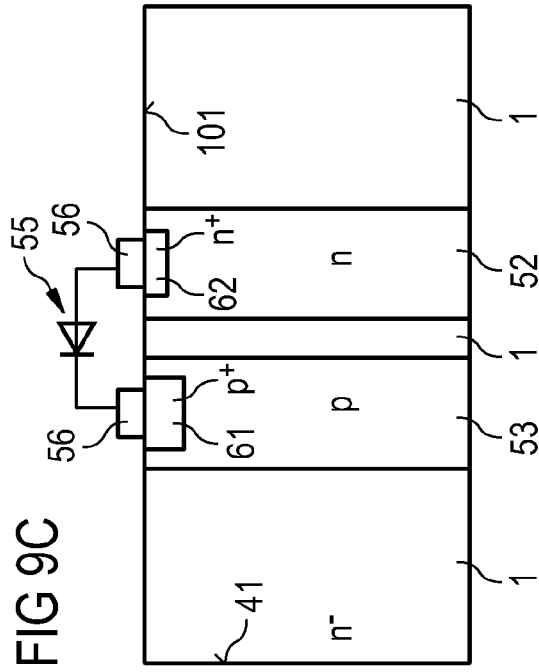
FIG. 9C illustrates a vertical cross-section through a peripheral area of a semiconductor device according to an embodiment.

With respect to FIGS. 9C to 10A diode structures that may be used as discharge structures are explained. FIG. 9C illustrates an embodiment with a diode 55 that may be formed on the main horizontal surface 101 e.g. as poly diode or somewhere else in the chip and is in Ohmic contact with the first and second equipotential semiconductor regions 52, 53 via a metallization 56 and optionally higher doped portions 62, 61 of the first equipotential semiconductor regions 52 and the second equipotential semiconductor regions 53, respectively. When the voltage of the second equipotential semiconductor regions 53 becomes lower than the voltage of the first equipotential semiconductor regions 52, the diode becomes forward biased and the second equipotential semiconductor regions 53 (and floating p-type regions connected thereto) discharges.

As illustrated in FIG. 9D, the diode 55 may be provided by a p-type semiconductor well 63 partly embedded in the first equipotential semiconductor regions 52, and a $n^+$-type cathode region 64 partly embedded in the well 63 and contacted via a metallization 56 and an optionally higher doped portions 61 of the second equipotential semiconductor regions 53. The well 63 is contacted to the first equipotential semiconductor regions 52 via a further metallization 57 and optionally higher doped portions 65, 62 of the well 63 and the first equipotential semiconductor regions 52, respectively.

Figure 10A:
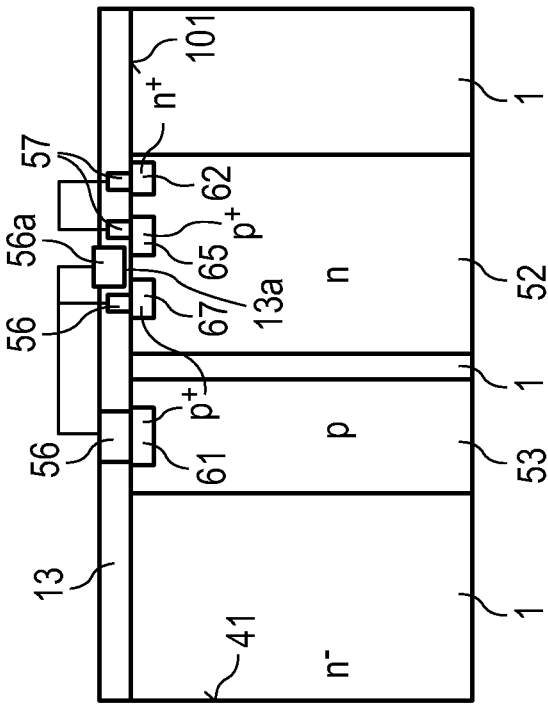
FIG. 10A illustrates a vertical cross-section through a peripheral area of a semiconductor device according to an embodiment.
Figure 10B:
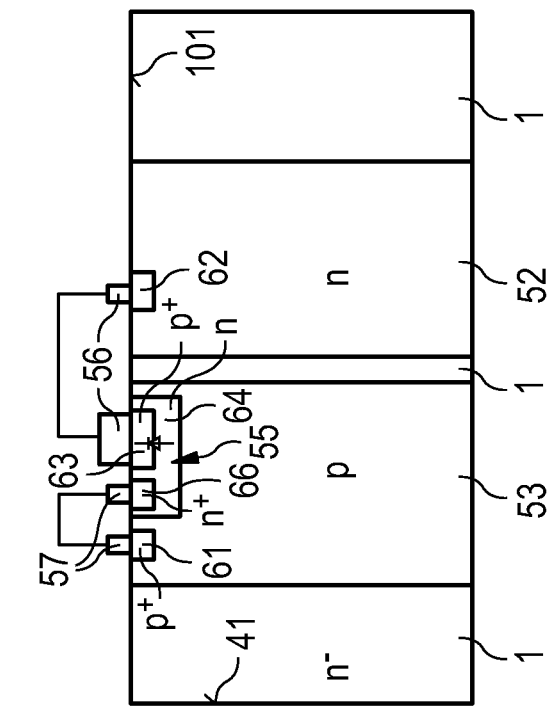
FIG. 10B illustrates a vertical cross-section through a peripheral area of a semiconductor device according to an embodiment.

As illustrated in FIG. 10A, the diode 55 may also be provided by an n-type semiconductor well 64 partly embedded in the second equipotential semiconductor regions 53, and a p⁺-type anode region 63 embedded in the well 64 and contacted via a metallization 56 and an optionally higher doped portions 62 of the first equipotential semiconductor regions 52. In this embodiment, the well 64 is contacted to the second equipotential semiconductor regions 53 via a further metallization 57 and higher doped portions 66, 61 of the well 64 and the second equipotential semiconductor regions 53, respectively.

According to an embodiment, a transistor-structure such as an MOSFET, a JFET or a bipolar junction transistor is used as a discharging structure. In the exemplary embodiment illustrated in FIG. 10B, the discharging structure is implemented as a p-channel MOSFET having a gate electrode 56a which is arranged above the first equipotential semiconductor regions 52 and separated from a channel portion of the first equipotential semiconductor region 52 between a p-type drain region 65 and a p-type source region 67 by a gate dielectric region 13a. The gate electrode 56a is in contact with the source region 67 and the second equipotential semiconductor regions 53 via a metallization 56 and optionally higher doped portions 61 of the second equipotential semiconductor regions 53. The drain region 65 is in contact with the first equipotential semiconductor regions 52 via a further metallization 57 and an optionally higher doped portion 62 of the second equipotential semiconductor regions 52. If the voltage of the second equipotential semiconductor regions 53 is more negative compared to the first equipotential semiconductor regions 52 than the threshold voltage of the MOSFET-structure, the second equipotential semiconductor regions 53 (and floating p-type regions connected thereto) discharges.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising a semiconductor body comprising a main horizontal surface, an active area, a punch through area, a source metallization arranged on the main horizontal surface and a drain metallization, in the active area the semiconductor body further comprising in a vertical cross-section substantially orthogonal to the main horizontal surface:
   a first charge-compensation structure comprising a plurality of spaced apart first n-type pillar regions; and
   an n-type first field-stop region comprised of a semiconductor material, in Ohmic contact with the drain metallization and the first n-type pillar regions, and having a doping concentration per area higher than a breakdown charge per area of the semiconductor material divided by the elementary charge,
in the punch-through area the semiconductor body further comprising:
   a p-type semiconductor region in Ohmic contact with the source metallization;
   a floating p-type body region extending from the punch-through area into the active area; and
   an n-type second field-stop region in Ohmic contact with the first field-stop region, forming a pn-junction with the floating p-type body region, arranged between the p-type semiconductor region and the floating p-type body region, and having a doping concentration per area lower than the breakdown charge per area of the semiconductor material divided by the elementary charge.

2. The semiconductor device of claim 1, wherein the first charge-compensation structure further comprises, in the vertical cross-section, first p-type pillar regions alternating with the first n-type pillar regions, wherein the first p-type pillar regions are in Ohmic contact with the source metallization, and wherein an integrated dopant concentration of the first n-type pillar regions substantially matches an integrated dopant concentration of the first p-type pillar regions.

3. The semiconductor device of claim 2, wherein the semiconductor body further comprises, in the vertical cross-section, a plurality of p-type body regions in Ohmic contact with the source metallization, wherein each of the p-type body regions is arranged on an adjoining one of the first p-type pillar regions and comprises a higher maximum doping concentration than the first p-type pillar regions.

4. The semiconductor device of claim 2, wherein the first n-type pillar regions and the first p-type pillar regions are substantially depletable at a reverse voltage applied between the source metallization and the drain metallization that is lower than a rated breakdown voltage of the semiconductor device.

5. The semiconductor device of claim 1, wherein the semiconductor body further comprises in the vertical cross-section at least one of:
   a cathode region adjoining the second field-stop region, having a higher maximum doping concentration than at least one of the first field-stop region and the second field-stop region, and forming a pn-junction with the floating body region;
   an edge delimiting the semiconductor body in a direction substantially parallel to the main horizontal surface;
   a first semiconductor region having a first maximum doping concentration of n-type dopants lower than a maximum doping concentration of the first field-stop region, arranged at least in the punch-through area, adjoining the second field-stop region and substantially extending to the main horizontal surface and to the edge;

an n-type drain region forming an Ohmic contact with the drain metallization; and a second charge-compensation structure arranged below the first charge-compensation structure and comprising a plurality of second n-type pillar regions adjoining the n-type first field-stop region and alternating with second p-type pillar regions adjoining the floating body region, wherein an integrated dopant concentration of the second n-type pillar regions substantially matches an integrated dopant concentration of the second p-type pillar regions.

6. The semiconductor device of claim 5, wherein the semiconductor body further comprises a peripheral area extending to the edge, and wherein the semiconductor device further comprises in the peripheral area at least one of:

an n-type channel-stop region adjoining the first semiconductor region, having a maximum doping concentration higher than the first maximum doping concentration and arranged at least close to the edge and/or the main horizontal surface;

an n-type third field-stop region in Ohmic contact with the first field-stop region, comprised of the semiconductor material and having a doping concentration per horizontal area higher than the breakdown charge per area of the semiconductor material divided by the elementary charge, wherein the second field-stop region is arranged between the third field-stop region and the first field-stop region;

an n-type first equipotential semiconductor region embedded in the first semiconductor region and extending from the third field-stop region substantially to the main horizontal surface;

a p-type second equipotential semiconductor region embedded in the first semiconductor region and extending from the floating body region substantially to the main horizontal surface;

a charge-generating structure arranged next to the main horizontal surface in Ohmic contact with at least one of the first equipotential semiconductor region and the second equipotential semiconductor region;

a metal layer arranged on the main horizontal surface and forming an abutting contact with the first equipotential semiconductor region and the second equipotential semiconductor region;

a silicide layer arranged on the main horizontal surface and in Ohmic contact with the first equipotential semiconductor region and the second equipotential semiconductor region;

a semiconductor region arranged at the main horizontal surface, in Ohmic contact with the first equipotential semiconductor region and the second equipotential semiconductor region, and comprising at least one of lattice defects and deep traps;

a dielectric region arranged on the main horizontal surface and extending between the first equipotential semiconductor region and the second equipotential semiconductor region, wherein at least one of the first equipotential semiconductor region, the second equipotential semiconductor region and a portion of the first semiconductor region arranged therebetween comprises at least close to the dielectric region at least one of lattice defects and deep traps;

a diode structure arranged next to the main horizontal surface and in Ohmic contact with the first equipotential semiconductor region and the second equipotential semiconductor region;

a transistor structure arranged next to the main horizontal surface and in Ohmic contact with the first equipotential semiconductor region and the second equipotential semiconductor region;

an n-type first semiconductor layer extending to the edge, adjoining the first semiconductor region, having a maximum doping concentration higher than the first semiconductor region, and being in the active area arranged between the second charge-compensation structure and the drain metallization;

an n-type third equipotential semiconductor region embedded in the first semiconductor region and extending from the first semiconductor layer substantially to the main horizontal surface; and an n-type drain layer extending to the edge, adjoining first semiconductor layer, having a maximum doping concentration higher than the first semiconductor layer, and forming an Ohmic contact with the drain metallization.

7. The semiconductor device of claim 5, wherein the first semiconductor region is substantially un-doped.

8. The semiconductor device of claim 1, wherein the doping concentration per area of the first field-stop region is at least about two times the breakdown charge per area of the semiconductor material divided by the elementary charge.

9. The semiconductor device of claim 1, wherein the floating body region is comprised of the semiconductor material and has a doping concentration per area higher than the breakdown charge per area of the semiconductor material divided by the elementary charge.

10. The semiconductor device of claim 1, wherein the first charge-compensation structure further comprises, in the vertical cross-section, trench field-electrodes alternating with the first n-type pillar regions, wherein each of the trench field-electrodes comprises a field-electrode in Ohmic contact with the source metallization and a field-dielectric region separating the field-electrode from adjacent first n-type pillar regions.

11. A semiconductor device, comprising a semiconductor body comprised of a semiconductor material having a breakdown charge per area, and comprising:

a drain region of a first conductivity type;

a plurality of spaced apart body regions of a second conductivity type;

a first charge-compensation structure arranged between the body regions and the drain region, and comprising, in a first cross-section, a plurality of spaced apart first pillar regions of the first conductivity type;

a second charge-compensation structure integrated in the semiconductor body, and comprising a plurality of spaced apart second pillar regions of the first conductivity type in Ohmic contact with the drain region;

a first field-stop region of the first conductivity type arranged between the first charge-compensation structure and the second charge-compensation structure, having a doping concentration per area higher than the breakdown charge per area of the semiconductor material divided by the elementary charge, and in Ohmic contact with the first pillar regions of the first conductivity type and the second pillar regions of the first conductivity type; and a second field-stop region of the first conductivity type having a doping concentration per area lower than the breakdown charge per area of the semiconductor material divided by the elementary charge, and in Ohmic contact with the first pillar regions via the first field-stop region.

12. The semiconductor device of claim 11, wherein the first charge-compensation structure further comprises, in the first vertical cross-section, first pillar regions of the second conductivity type alternating with the first pillar regions of the first conductivity type, wherein each of the first pillar regions of the second conductivity type adjoins one of the body regions.

13. The semiconductor device of claim 11, wherein the second charge-compensation structure further comprises at least one of charge generation centers and in the first vertical cross-section, second pillar regions of the second conductivity type alternating with the second pillar regions of the first conductivity type, and wherein the floating body region adjoins at least one of the second pillar regions of the second conductivity type.

14. The semiconductor device of claim 11, wherein the second charge-compensation structure further comprises, in a second vertical cross-section substantially orthogonal to the first vertical cross-section, second pillar regions of the second conductivity type alternating with the second pillar regions of the first conductivity type, and wherein the floating body region adjoins at least one of the second pillar regions of the second conductivity type.

15. The semiconductor device of claim 11, wherein the semiconductor body further comprises an edge delimiting the semiconductor body in a direction substantially parallel to the first cross-section, an active area and a punch-through area arranged between the active area and the edge, wherein the first semiconductor region substantially extends to the edge, wherein the first charge-compensation structure, the second charge-compensation structure and the first field-stop region are arranged in the active area, wherein the second field-stop region is arranged in the punch-through area, and wherein the semiconductor body further comprises in the punch-through area at least one of:
  a first semiconductor region having a first maximum doping concentration of dopants of the first conductivity type lower than a maximum doping concentration of the first field-stop region adjoining at least one of the first field-stop region and the second field-stop region;
  a further body region of the second conductivity type in Ohmic contact with the body regions and forming a pn-junction with the first semiconductor region;
  a floating body region of the second conductivity type adjoining at least one of the first field-stop region and the second field-stop region; and
  a cathode region of the first conductivity type adjoining the second field-stop region, having a higher maximum doping concentration than at least one of the first field-stop region and the second field-stop region, and forming a pn-junction with the floating body region.

16. The semiconductor device of claim 15, wherein the semiconductor body further comprises a peripheral area extending to the edge, wherein the first semiconductor region substantially extends to at least one of the edge and a main horizontal surface of the semiconductor body which is substantially parallel to the first vertical cross-section, wherein the punch-through area is arranged between the active area and the peripheral area, and wherein the semiconductor device further comprises in the peripheral area at least one of:
  a channel-stop region of the first conductivity type adjoining the first semiconductor region, having a maximum doping concentration higher than the first maximum doping concentration and arranged at least close to the edge and/or the main horizontal surface;
  a third field-stop region of the first conductivity type in Ohmic contact with the first field-stop region, and having a doping concentration per horizontal area higher than the breakdown charge per area of the semiconductor material divided by the elementary charge, wherein the second field-stop region is arranged between the first field-stop region and the third field-stop region;
  a first equipotential semiconductor region of the first conductivity type embedded in the first semiconductor region and extending from the third field-stop region substantially to the main horizontal surface;
  a second equipotential semiconductor region of the second conductivity type embedded in the first semiconductor region and extending from the floating body region substantially to the main horizontal surface;
  a first semiconductor layer extending to the edge, adjoining the first semiconductor region, having a maximum doping concentration higher than the first maximum doping concentration, and being in the active area arranged between the second charge-compensation structure and the drain metallization;
  a third equipotential semiconductor region of the first conductivity type embedded in the first semiconductor region and extending from the first semiconductor layer substantially to the main horizontal surface;
  a drain layer of the first conductivity type extending to the edge, adjoining first semiconductor layer, having a maximum doping concentration higher than the first semiconductor layer, and forming an Ohmic contact with the drain metallization;
  a charge-generating structure arranged next to the main horizontal surface in Ohmic contact with at least one of the first equipotential semiconductor region and the second equipotential semiconductor region;
  a metal layer arranged on the main horizontal surface and forming an abutting contact with the first equipotential semiconductor region and the second equipotential semiconductor region;
  a silicide layer arranged on the main horizontal surface and in Ohmic contact with the first equipotential semiconductor region and the second equipotential semiconductor region;
  a semiconductor region arranged on the main horizontal surface, in Ohmic contact with the first equipotential semiconductor region and the second equipotential semiconductor region, and comprising at least one of lattice defects and deep traps;
  a dielectric region arranged on the main horizontal surface and extending between the first equipotential semiconductor region and the second equipotential semiconductor region, wherein at least one of the first equipotential semiconductor region, the second equipotential semiconductor region and a portion of the first semiconductor region arranged between the first equipotential semiconductor region and the second equipotential semiconductor region comprises at least close to the dielectric region at least one of lattice defects and deep traps;
  a diode structure arranged next to the main horizontal surface and in Ohmic contact with the first equipotential semiconductor region and the second equipotential semiconductor region;

a transistor structure arranged next to the main horizontal surface and in Ohmic contact with the first equipotential semiconductor region and the second equipotential semiconductor region.

17. A semiconductor device, comprising a semiconductor body comprised of a semiconductor material having a breakdown charge per area and comprising a main horizontal surface, an active area, a punch through area, a source metallization arranged on the main horizontal surface and a drain metallization, in the active area the semiconductor body further comprising in a vertical cross-section substantially orthogonal to the main horizontal surface:
- a first charge-compensation structure comprising a plurality of spaced apart first p-type pillar regions in Ohmic contact with the source metallization;
- a second charge-compensation structure comprising a plurality of spaced apart second p-type pillar regions; and
- an n-type first embedded field-stop region in Ohmic contact with the drain metallization arranged between the first p-type pillar regions and the second p-type pillar regions, and having a doping concentration per area higher than the breakdown charge per area of the semiconductor material divided by the elementary charge, in the punch-through area the semiconductor body further comprising:
- a first semiconductor region in Ohmic contact with the drain metallization;
- a p-type semiconductor region in Ohmic contact with the source metallization and forming a pn-junction with the first semiconductor region;
- a floating p-type body region extending from the punch-through area into the active area, having a higher maximum doping concentration than the second p-type pillar regions and adjoining each of the second p-type pillar regions; and
- an n-type second embedded field-stop region in Ohmic contact with the first embedded field-stop region, forming a pn-junction with the floating p-type body region, arranged between the first semiconductor region and the floating p-type body region, and having a doping concentration per area lower than the breakdown charge per area of the semiconductor material divided by the elementary charge.

18. The semiconductor device of claim 17, wherein the first p-type pillar regions are substantially depletable at a reverse voltage applied between the source metallization and the drain metallization that is lower than a rated breakdown voltage of the semiconductor device.

19. A vertical semiconductor device, comprising a semiconductor body comprising a main horizontal surface and an edge delimiting the semiconductor body in a direction substantially parallel to the main horizontal surface, a first metallization arranged on the main horizontal surface, and a second metallization arranged opposite to the first metallization, the semiconductor body further comprising:
- a first semiconductor region having a first maximum doping concentration in Ohmic contact with the second metallization, and substantially extending to at least one of the main horizontal surface and the edge;
- an embedded field-stop zone of a first conductivity type in Ohmic contact with the first semiconductor region and the second metallization, having a maximum doping concentration higher than the first maximum doping concentration, and adjoining the first semiconductor region;
- a second semiconductor region of a second conductivity type in Ohmic contact with the first metallization, arranged at least close to the main horizontal surface, forming a rectifying junction with the first semiconductor region, and overlapping with the embedded field-stop zone when viewed from above;
- a floating body region of the second conductivity type arranged between the embedded field-stop zone and the second metallization, and forming a pn-junction with the embedded field-stop zone;
- a first equipotential semiconductor region of the first conductivity type embedded in the first semiconductor region, extending from the embedded field-stop region substantially to the main horizontal surface, and arranged between the second semiconductor region and the edge; and
- a second equipotential semiconductor region of the second conductivity type embedded in the first semiconductor region, extending from the floating body region substantially to the main horizontal surface, and arranged between the first equipotential semiconductor region and the edge.

20. The semiconductor device of claim 19, wherein the semiconductor body further comprises at least one of:
- a charge-generating structure arranged next to the main horizontal surface and in Ohmic contact with at least one of the first equipotential semiconductor region and the second equipotential semiconductor region;
- a first charge-compensation structure arranged between the main horizontal surface and the embedded field-stop zone, and comprising, in a vertical cross-section substantially orthogonal to the main horizontal surface, a plurality of alternating first pillar regions of the first conductivity type and first pillar regions of the second conductivity type, the first pillar regions of the first conductivity type being in Ohmic contact with the embedded field-stop zone, and the first pillar regions of the second conductivity type being in Ohmic contact with the first metallization;
- a first charge-compensation structure arranged between the main horizontal surface and the embedded field-stop zone, and comprising, in a vertical cross-section substantially orthogonal to the main horizontal surface, a plurality of alternating first pillar regions of the first conductivity type and insulated trench field-electrodes, the first pillar regions of the first conductivity type being in Ohmic contact with the embedded field-stop zone, wherein each of the trench field-electrodes comprises a field-electrode in Ohmic contact with the first metallization and a field-dielectric region separating the field-electrode from adjacent first n-type pillar regions;
- a second charge-compensation structure arranged between the floating body region and the second metallization, and comprising, in a vertical cross-section substantially orthogonal to the main horizontal surface, a plurality of alternating second pillar regions of the first conductivity type and second pillar regions of the second conductivity type, the second pillar regions of the first conductivity type being in Ohmic contact with the embedded field-stop zone, and the second pillar regions of the second conductivity type being in Ohmic contact with floating body region;
- a first semiconductor layer of the first conductivity type extending to the edge, adjoining the first semiconductor region, having a maximum doping concentration higher than the first maximum doping concentration, and arranged between the second charge-compensation structure and the second metallization;

a third equipotential semiconductor region of the first conductivity type embedded in the first semiconductor region and extending from the first semiconductor layer substantially to the main horizontal surface; and
a drain layer of the first conductivity type extending to the edge, adjoining first semiconductor layer, having a maximum doping concentration higher than the first semiconductor layer, and forming an Ohmic contact with the second metallization.

* * * * *